(12) United States Patent
Park

(10) Patent No.: US 9,681,509 B2
(45) Date of Patent: Jun. 13, 2017

(54) LIGHT-EMITTING DEVICE PACKAGE AND ELECTRONIC DEVICE INCLUDING LIGHT-EMITTING DEVICE

(71) Applicant: SAMSUNG ELECTRONICS CO., LTD., Suwon-si (KR)

(72) Inventor: In-soo Park, Suwon-si (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 0 days.

(21) Appl. No.: 14/969,191

(22) Filed: Dec. 15, 2015

(65) Prior Publication Data

US 2016/0262230 A1    Sep. 8, 2016

(30) Foreign Application Priority Data

Mar. 6, 2015    (KR) .................. 10-2015-0031961

(51) Int. Cl.
| | | |
|---|---|---|
| H05B 33/08 | (2006.01) | |
| H01L 25/075 | (2006.01) | |
| H01L 25/16 | (2006.01) | |
| H01L 23/00 | (2006.01) | |
| H01L 33/38 | (2010.01) | |
| H01L 33/48 | (2010.01) | |

(52) U.S. Cl.
CPC ......... *H05B 33/0821* (2013.01); *H01L 24/73* (2013.01); *H01L 25/0753* (2013.01); *H01L 25/167* (2013.01); *H05B 33/0803* (2013.01); *H01L 33/382* (2013.01); *H01L 33/486* (2013.01); *H01L 2224/24137* (2013.01); *H01L 2224/48091* (2013.01); *H01L 2224/48227* (2013.01); *H01L 2224/73227* (2013.01); *H01L 2224/73265* (2013.01)

(58) Field of Classification Search
CPC . H05B 33/0821; H01L 33/62; H01L 25/0753; H01L 25/167
See application file for complete search history.

(56) References Cited

U.S. PATENT DOCUMENTS

| | | | |
|---|---|---|---|
| 6,115,233 A | * | 9/2000 | Seliskar .............. H01L 27/0688 257/296 |
| 6,372,608 B1 | | 4/2002 | Shimoda et al. |
| 6,645,830 B2 | | 11/2003 | Shimoda et al. |
| RE38,466 E | | 3/2004 | Inoue et al. |
| 6,818,465 B2 | | 11/2004 | Biwa et al. |
| 6,818,530 B2 | | 11/2004 | Shimoda et al. |
| 6,858,081 B2 | | 2/2005 | Biwa et al. |
| 6,967,353 B2 | | 11/2005 | Suzuki et al. |

(Continued)

FOREIGN PATENT DOCUMENTS

| | | |
|---|---|---|
| JP | 2007-3947 A | 1/2007 |
| KR | 10-1252118 B1 | 4/2013 |

*Primary Examiner* — Douglas W Owens
*Assistant Examiner* — Jonathan G Cooper
(74) *Attorney, Agent, or Firm* — Sughrue Mion, PLLC

(57) ABSTRACT

A light-emitting device package includes a substrate; a light-emitting device provided on the substrate and configured to be driven by an AC power supply; and a capacitor connected in series with the light-emitting device, where a capacitance of the capacitor varies so that a current flowing through the light-emitting device and flowing through the capacitor is maintained at a constant value according to a variation in temperatures of the light-emitting device and the capacitor.

20 Claims, 25 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,279,724 B2 | 10/2007 | Collins, III et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,812,587 B2 | 10/2010 | Suzuki et al. |
| 7,830,095 B2 | 11/2010 | Erhardt |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,299,715 B2 | 10/2012 | Philippbar et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,530,906 B2 | 9/2013 | Dekker et al. |
| 8,536,604 B2 | 9/2013 | Kwak et al. |
| 8,735,931 B2 | 5/2014 | Han et al. |
| 8,766,295 B2 | 7/2014 | Kim |
| 2005/0146840 A1* | 7/2005 | Lee .................. H01G 4/20 361/312 |
| 2007/0273299 A1* | 11/2007 | Miskin ............ H05B 33/0818 315/250 |
| 2008/0218095 A1* | 9/2008 | Erhardt ............ H01G 4/40 315/224 |
| 2013/0146934 A1* | 6/2013 | Lin .................. H01L 33/38 257/99 |

* cited by examiner

FIG. 21

| USAGE | PHOSPHOR |
|---|---|
| LED TV BLU | $\beta$-SiAlON:Eu$^{2+}$<br>(Ca, Sr)AlSiN$_3$:Eu$^{2+}$<br>La$_3$Si$_6$O$_{11}$:Ce$^{3+}$<br>K$_2$SiF$_6$:Mn$^{4+}$<br>K$_2$TiF$_6$:Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4)    (1) |
| ILLUMINATION | Lu$_3$Al$_5$O$_{12}$:Ce$^{3+}$<br>Ca-$\alpha$-SiAlON:Eu$^{2+}$<br>La$_3$Si$_6$N$_{11}$:Ce$^{3+}$<br>(Ca, Sr)AlSiN$_3$:Eu$^{2+}$<br>Y$_3$Al$_5$O$_{12}$:Ce$^{3+}$<br>K$_2$SiF$_6$:Mn$^{4+}$<br>K$_2$TiF$_6$:Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4)    (1) |
| Side View<br>(Mobile, Note PC) | Lu$_3$Al$_5$O$_{12}$:Ce$^{3+}$<br>Ca-$\alpha$-SiAlON:Eu$^{2+}$<br>La$_3$Si$_6$N$_{11}$:Ce$^{3+}$<br>(Ca, Sr)AlSiN$_3$:Eu$^{2+}$<br>Y$_3$Al$_5$O$_{12}$:Ce$^{3+}$<br>(Sr, Ba, Ca, Mg)$_2$SiO$_4$:Eu$^{2+}$<br>K$_2$SiF$_6$:Mn$^{4+}$<br>K$_2$TiF$_6$:Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4)    (1) |
| ELECTRICAL COMPONENT<br>(Head Lamp, etc.) | Lu$_3$Al$_5$O$_{12}$:Ce$^{3+}$<br>Ca-$\alpha$-SiAlON:Eu$^{2+}$<br>La$_3$Si$_6$N$_{11}$:Ce$^{3+}$<br>(Ca, Sr)AlSiN$_3$:Eu$^{2+}$<br>Y$_3$Al$_5$O$_{12}$:Ce$^{3+}$<br>K$_2$SiF$_6$:Mn$^{4+}$<br>K$_2$TiF$_6$:Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4)    (1) |

LIGHT-EMITTING DEVICE PACKAGE AND ELECTRONIC DEVICE INCLUDING LIGHT-EMITTING DEVICE

CROSS-REFERENCE TO RELATED APPLICATION

This application claims the benefit of Korean Patent Application No. 10-2015-0031961, filed on Mar. 6, 2015, in the Korean Intellectual Property Office, the disclosure of which is incorporated herein in its entirety by reference.

BACKGROUND

1. Field

The exemplary embodiments relate to a light-emitting device package and an electronic device including a light-emitting device, and more particularly, to a light-emitting device package and an electronic device including a light-emitting device, which are capable of preventing a driving current of the light-emitting device from increasing.

2. Description of the Related Art

A light-emitting device may convert an electric signal into a light beam though a PN junction. The light-emitting device has been used in various fields, including indoor and outdoor lighting applications, vehicle headlights, backlight units (BLUs) for display devices, and medical devices. Therefore, there is a need to develop a light-emitting device package and an electronic device including a light-emitting device, which are capable of securing the reliability and long-term stability of products.

SUMMARY

The exemplary embodiments provide a light-emitting device package and an electronic device including a light-emitting device, which are capable of preventing a driving current and power consumption of the light-emitting device from increasing even when a temperature of the light-emitting device increases, and preventing the lifetime of the light-emitting device from being reduced.

According to an aspect of an exemplary embodiment, there is provided a light-emitting device package including: a substrate; a light-emitting device provided on the substrate and configured to be driven by an AC power supply; and a capacitor connected in series with the light-emitting device, wherein a capacitance of the capacitor varies according to a variation in temperatures of the light-emitting device and the capacitor, so that a current flowing through the light-emitting device and flowing through the capacitor is maintained at a constant value.

A variation in the capacitance of the capacitor for a charging time tc of the capacitor may satisfy the following formula:

$$\Delta C = \left[ \frac{C^2 \Delta V(t_c)}{C \Delta V(t_c) + I_0 t_c} \right]$$

where $I_0$ is the current that flows through the light-emitting device and flows through the capacitor and is measured at an initial temperature T0, C is an initial capacitance of the capacitor, $\Delta V(t_c)$ is a variation in a voltage of the light-emitting device, and tc is the charging time of the capacitor.

The capacitor may include a first plate, a second plate, and a dielectric provided between the first plate and the second plate, and in order for the capacitor to vary so that the current flowing through the light-emitting device and flowing through the capacitor is maintained at the constant value, a cross-sectional area S of the capacitor, a distance d between the first plate and the second plate, and a variation $d\epsilon_r/dT$ in a dielectric constant of the dielectric with respect to temperature are determined based on the following formula:

$$\Delta C = \frac{dC}{dT} = \left( \epsilon_0 \frac{S}{D} \right) \frac{d\epsilon_r}{dT}$$

where $\epsilon_0$ is a permittivity in free space and $\epsilon_r$ is a relative permittivity.

The capacitor may include: a dielectric that penetrates the substrate; a first plate that contacts a top surface of the dielectric; and a second plate that contacts a bottom surface of the dielectric.

The light-emitting device may be provided on the first plate to overlap the dielectric in a direction perpendicular to a surface of the light-emitting device.

An overlapping cross-sectional area of the light-emitting device and the dielectric may be substantially equal to a cross-sectional area of the dielectric.

The light-emitting device may be of a plurality of light-emitting devices, and the capacitor may be provided of a plurality of capacitors. The plurality of capacitors may include a plurality of dielectrics that penetrate the substrate, and a plurality of first plates that respectively come into contact with top surfaces of the plurality of dielectrics, and the plurality of light-emitting devices may be respectively provided on the plurality of first plates so as to overlap the plurality of dielectrics.

The plurality of capacitors may be connected in parallel to one another.

The light-emitting device may be of a plurality of light-emitting devices, and one of the plurality of light-emitting devices may be provided on the first plate so as to overlap the dielectric in a direction perpendicular to a surface of the light-emitting device.

The light-emitting device package may be configured to control a direction of a driving current flowing through the light-emitting device independently from using an LED driver.

The light-emitting device may be thermally coupled to the capacitor.

The capacitor may include a dielectric, and the dielectric constant of the dielectric is reduced according to an increase in a temperature of the dielectric.

According to another aspect of an exemplary embodiment, there is provided an electronic device including: a substrate; a light-emitting device package provided on the substrate, the light-emitting device package including a light-emitting device driven by an AC power supply; and a capacitor connected in series with the light-emitting device, wherein the capacitor is configured to have a capacitance which decreases according to an increase in a temperature of the capacitor.

The capacitor may be embedded in the substrate.

The capacitor may be provided in parallel to the light-emitting device package on the substrate.

BRIEF DESCRIPTION OF THE DRAWINGS

Exemplary embodiments will be more clearly understood from the following detailed description taken in conjunction with the accompanying drawings in which:

FIG. 21 is a table showing types of phosphors according to applications of a white light-emitting device using a blue light-emitting device;

DETAILED DESCRIPTION OF THE EXEMPLARY EMBODIMENTS

Figure 1A:
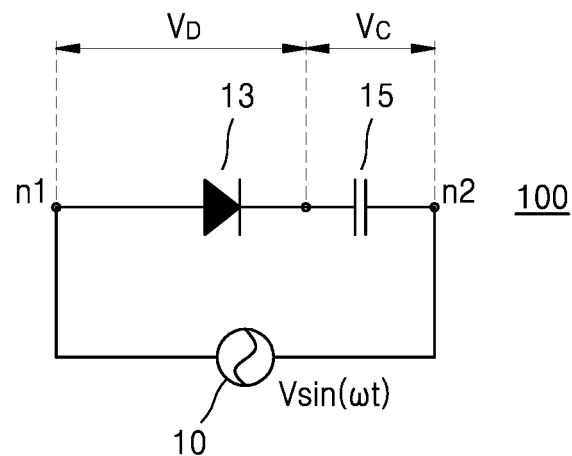
FIG. 1A is a circuit diagram of a light-emitting device package according to an exemplary embodiment.

Hereinafter, exemplary embodiments will be described with reference to the accompanying drawings. The exemplary embodiments may, however, be embodied in many different forms and should not be construed as being limited to the exemplary embodiments set forth herein; rather, these exemplary embodiments are provided so that this disclosure will be thorough and complete, and will fully convey the exemplary embodiments to those of ordinary skill in the art. It should be understood, however, that there is no intent to limit the exemplary embodiments to the particular forms disclosed, but on the contrary, the exemplary embodiments are to cover all modifications, equivalents, and alternatives falling within the spirit and scope of the exemplary embodiments. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", "third", etc., may be used herein to describe various elements, these elements should not be limited by these terms. These terms are only used to distinguish one element from another. For example, a first element may be referred to as a second element, and similarly, a second element may be referred to as a first element without departing from the scope of protection of the exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes.

In addition, in the drawings, the dimensions of structures may be exaggerated for clarity of the exemplary embodiments.

FIG. 1A is a circuit diagram of a light-emitting device package 100 according to an exemplary embodiment.

Referring to FIG. 1A, the light-emitting device package 100 may include a light-emitting device 13 disposed between a first node n1 and a second node n2, and a capacitor 15 connected in series with the light-emitting device 13. The light-emitting device package 100 may be driven by an AC power supply 10. For example, a voltage such as V sin(ωt) may be applied to the light-emitting diode package 100. A capacitance of the capacitor 15 may vary so that a constant driving current flows through the light-emitting device 13. A capacitor voltage $V_C$ may be applied to the capacitor 15 so as to compensate for a variation in a light-emitting device voltage $V_D$. Even when a temperature of the capacitor 15 increases, the capacitance of the capacitor 15 may vary so that a constant current flows through the light-emitting device 13 and the capacitor 15. That is, the capacitor 15 may include a dielectric, a dielectric constant of which is reduced so that a constant current flows through the light-emitting device 13 and the capacitor 15.

A temperature of the light-emitting device package 100 may increase due to heat generated therein, which increases the driving current flowing through the light-emitting device package 100. The increase in the driving current may increase power consumption and reduce the lifetime of the light-emitting device 13. The light-emitting device package 100 according to an exemplary embodiment includes the capacitor 15 that includes the dielectric, the dielectric constant of which is reduced so that the driving current is maintained constant according to the increase in the temperature of the light-emitting device package 100. Even when the temperature of the light-emitting device package 100 increases, the driving current flowing through the light-emitting device package 100 may be maintained constant by increasing an impedance of the capacitor 15.

Figure 1B:
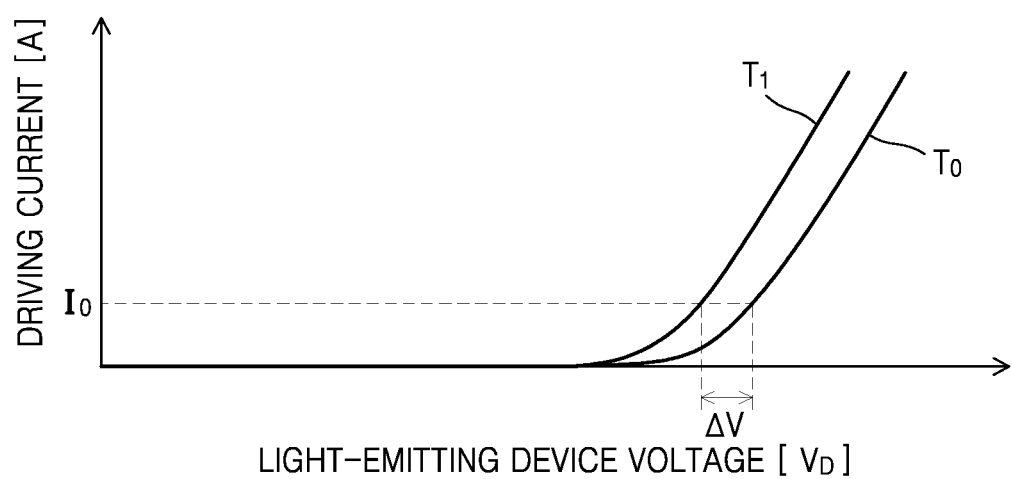
FIG. 1B is a graph showing driving currents flowing through a light-emitting device package at a first temperature and a second temperature with respect to a light-emitting device voltage.

FIG. 1B is a graph showing driving currents $I_O$ flowing through the light-emitting device 13 at a first temperature $T_0$ and a second temperature $T_1$ with respect to the light-emitting device voltage $V_D$. At this time, the first temperature $T_0$ may be an initial temperature of the light-emitting device 13. In the light-emitting device 13, it may be necessary to change the light-emitting device voltage $V_D$ so that the driving current $I_O$ at the second temperature $T_1$ is maintained at the same level as the driving current $I_O$ at the first temperature $T_0$. The capacitor 15 may be connected in series with the light-emitting device 13, and a voltage applied thereto varies so as to compensate for a variation in the voltage of the light-emitting device 13. At this time, the voltage applied to the capacitor 15 depends on a variation in the impedance of the capacitor 15, and a variation in the capacitance of the capacitor 15 may be expressed as Formula (1) below:

$$\Delta C = \left[ \frac{C^2 \Delta V(t_c)}{C \Delta V(t_c) + I_0 t_c} \right] \quad (1)$$

In Formula (1) above, $\Delta C$ is the variation in the capacitance of the capacitor 15 and is a difference between a first capacitance of the capacitor 15 at the first temperature $T_0$ and a second capacitance of the capacitor 15 at the second temperature $T_1$. C is the first capacitance of the capacitor 15 at the first temperature $T_0$. $t_c$ is a charging time of the capacitor 15. $I_O$ is an average driving current flowing through the light-emitting device 13 and the capacitor 15, the average driving current being measured at the first temperature $T_0$ for $t_c$. $\Delta V(t_c)$ is the variation in the voltage of the capacitor 15 and is a difference between a first capacitor voltage at the first temperature $T_0$ for $t_c$ and a second capacitor voltage at the second temperature $T_1$ for $t_c$.

For example, in the case of the capacitor 15 having a charging time tc of about 3.75 ms, when the first temperature $T_0$ of the capacitor 15 is about 25° C., the first capacitance C is 230 nF and the driving current $I_O$ is about 10.09 mA. Also, when the temperature of the capacitor 15 changes from the first temperature $T_0$ of about 25° C. to the second temperature $T_1$ of about 85° C., the variation $\Delta V(t_c)$ in the voltage of the capacitor 15 may be about 16.396 V. In this case, from Formula (1) above, the variation in the capacitance of the capacitor 15 is equal to about 19.4 nF. That is, the second capacitance of the capacitor 15 at the second temperature $T_1$ is about 210.6 nF, which is reduced from the first capacitance (about 230 nF) of the capacitor 15 at the first temperature $T_0$ by the variation (about 19.4 nF) in the capacitance of the capacitor 15. Therefore, even at the second temperature $T_1$, the light-emitting device 13 and the capacitor 15 may maintain a driving current of about 10.09 mA, which is the same as the driving current $I_0$ at the first temperature $T_0$.

Figure 2:
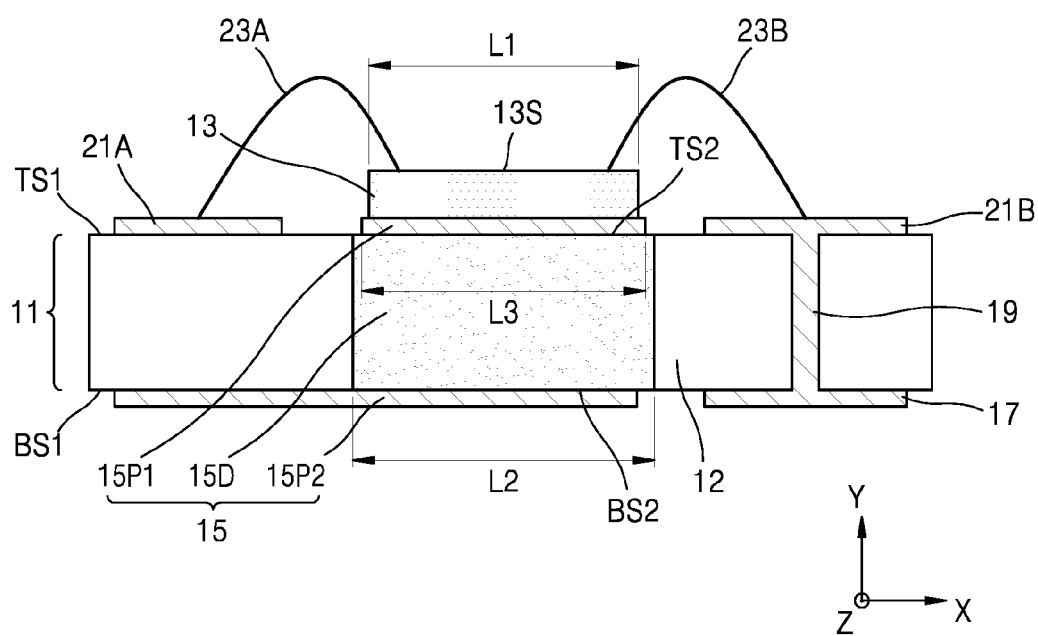
FIG. 2 is a cross-sectional view of a light-emitting device package according to an exemplary embodiment.

Referring to FIGS. 1A, 1B, and FIG. 2, in order to meet the variation $\Delta C$ in the capacitance of the capacitor 15, a cross-sectional area S of the capacitor 15, a distance d between a first plate 15P1 and a second plate 15P2, and a variation in $d\varepsilon_r/dT$ the dielectric constant of a dielectric 15D with respect to temperature may be determined based on Formula (2) below.

$$\Delta C = \frac{dC}{dT} = \left( \varepsilon_0 \frac{S}{D} \right) \frac{d\varepsilon_r}{dT} \quad (2)$$

In Formula (2) above, $\varepsilon_0$ is a permittivity in free space, and $\varepsilon_r$ is a relative permittivity. Also, the cross-sectional area S of the capacitor 15 may be a commonly overlapping area between the first and second plates 15P1 and 15P2 and the dielectric 15D.

For example, assuming that the permittivity $\varepsilon_0$ in free space is about $8.854 \times 10^{-12}$ F/m, the cross-sectional area S of the capacitor 15 is about $1.5 \times 1.5$ mm$^2$, and the distance d between the first plate 15P1 and the second plate 15P2 is about 200 nm, the variation $\Delta C$ in the capacitance of the capacitor 15 may be satisfied if the relative permittivity $\varepsilon_r$ varies by about 2410 F/m with respect to a temperature difference between the first temperature $T_0$ and the second temperature $T_1$. In this case, a rutile-based material, for example, $TiO_2$ and $BaTiO_3$, may be used as a representative material of the capacitor 15.

As described above, the capacitance of the capacitor 15 may vary so that the current flowing through the light-emitting device 13 and the capacitor 15 is maintained to be constant even when the temperatures of the light-emitting device 13 and the capacitor 15 vary.

Figure 1C:
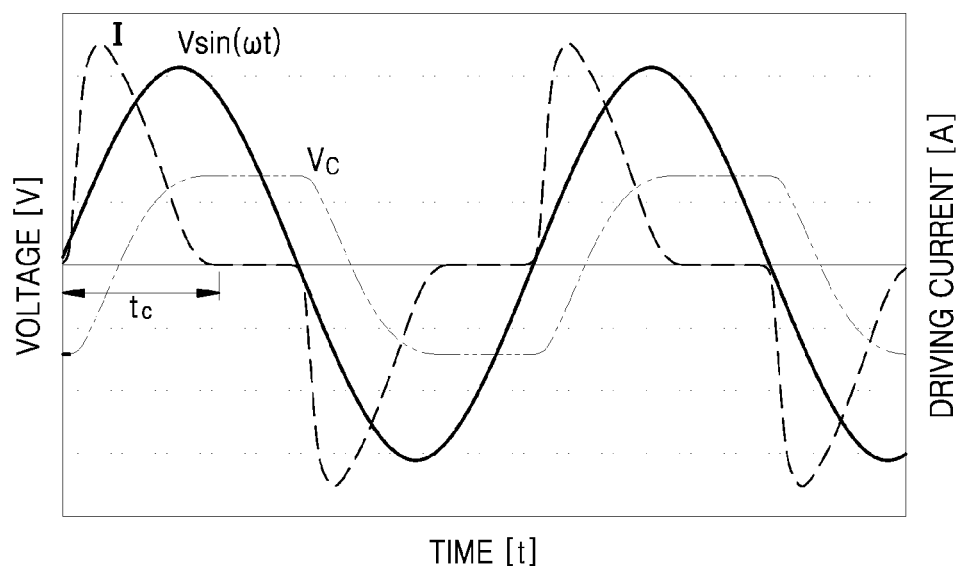
FIG. 1C is a graph showing a voltage applied to a light-emitting device package, a voltage applied to a capacitor, and a driving current flowing through the light-emitting device package, according to an exemplary embodiment.

FIG. 1C is a graph showing the voltage V sin(ωt) applied to the light-emitting device package 100, the capacitor voltage Vc applied to the capacitor 15, and the driving current $I_O$ flowing through the light-emitting device package 100, according to an exemplary embodiment.

FIG. 2 is a cross-sectional view of a light-emitting device package 100A according to an exemplary embodiment. The light-emitting device package 100A may be an exemplary embodiment of the light-emitting device package 100 of FIG. 1.

Referring to FIG. 2, the light-emitting device package 100A may include a substrate 11, a light-emitting device 13 disposed on the substrate 11, and a capacitor 15 connected in series with the light-emitting device 13, a capacitance of the capacitor 15 being reduced according to an increase in the temperature of the capacitor 15. The light-emitting device package 100A may be driven by an AC power supply (not illustrated).

The substrate 11 may be embedded with the capacitor 15, and the embedded capacitor 15 may support the light-emitting device 13. The capacitor 15 may include a dielectric 15D that penetrates the substrate 11, a first plate 15P1 that comes into contact with a top surface TS2 of the dielectric 15D, and a second plate 15P2 that comes into contact with a bottom surface BS2 of the dielectric 15D. In addition, the light-emitting device 13 may be disposed on the first plate 15P1. The contact surfaces of the light-emitting device 13 and the first plate 15P1 may be electrically insulated from each other, and may freely conduct heat (e.g., heat energy).

A first electrode pad 21A and a second electrode pad 21B may be disposed on a top surface TS1 of the substrate 11. The light-emitting device 13 may have a lateral light-emitting device structure in which a first-conductivity-type semiconductor layer and a second-conductivity-type semiconductor layer are formed on a top surface 13S of the light-emitting device 13. In this case, the first-conductivity-type semiconductor layer of the light-emitting device 13 may be electrically connected to the first electrode pad 21A through a first wire 23A, and the second-conductivity-type semiconductor layer of the light-emitting device 13 may be electrically connected to the second electrode pad 21B through a second wire 23B.

Figure 3A:
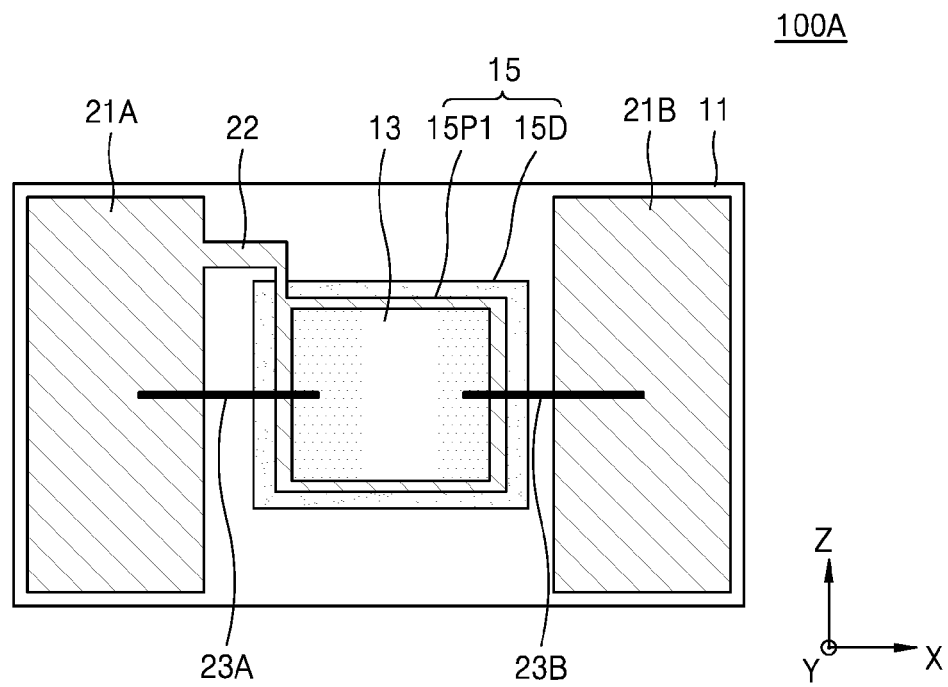
FIGS. 3A and 3B are respectively a plan view and a bottom view of the light-emitting device package of FIG. 2.

The second electrode pad 21B may be electrically connected to a third electrode pad 17 disposed on a bottom surface BS1 of the substrate 11 through a through-via 19 penetrating the substrate 11. The first electrode pad 21A may be electrically connected to the first plate 15P1. Referring to FIG. 3A, the first electrode pad 21A may be connected to the first plate 15P1 through a wiring 22. The first plate 15P1 may be electrically connected to the second plate 15P2 through the dielectric 15D.

Referring again to FIG. 1A, the third electrode pad 17 may correspond to a first node n1 and may be connected to an external power supply. The second plate 15P2 may correspond to a second node n2 and may be connected to the external power supply.

That is, the first node n1 and the second node n2 of the light-emitting device package 100A may be connected to an AC power supply 10. A driving current, which is generated from the AC power supply 10, may be electrically transferred from the first node n1 or the third electrode pad 17 to the light-emitting device 13 through the through-via 19, the second electrode pad 21B, and the second wire 23B. In addition, the driving current, which is transferred to the second-conductivity-type semiconductor layer of the light-emitting device 13, may flow through an active layer (not illustrated) and the first-conductivity-type semiconductor layer of the light-emitting device 13 to thereby generate a light beam. The driving current, which is transferred to the light-emitting device 13, may be transferred to the capacitor 15 through the first wire 23A, the first electrode pad 21A, and the wiring 22. The driving current, which is transferred to the first plate 15P1 of the capacitor 15, may be transferred to the second plate 15P2 or the second node n2 through the dielectric 15D.

FIG. 2 illustrates a structure of the series connection of the light-emitting device 13 and the capacitor 15. However, the exemplary embodiments are not limited to the structure of FIG. 2. In addition, FIG. 2 illustrates a wire bonding method, by which the light-emitting device 13 is electrically connected to the capacitor 15 through the first wire 23A, the first electrode pad 21A, and the wiring 22 of FIG. 3A, and the light-emitting device 13 is electrically connected to the second electrode pad 21B through the second wire 23B. However, the exemplary embodiments are not limited to the wire bonding method of FIG. 2.

In some exemplary embodiments, the light-emitting device 13 may be electrically connected to the first plate 15P1 and the second electrode pad 21B by flip-chip bonding. In this case, the first-conductivity-type semiconductor layer and the second-conductivity-type semiconductor layer of the light-emitting device 13 may be connected to the first plate 15P1 and the second electrode pad 21B, respectively. In some exemplary embodiments, the light-emitting device 13 may have a vertical light-emitting device structure in which the first-conductivity-type semiconductor layer and the second-conductivity-type semiconductor layer are respectively disposed on opposite sides thereof. In this case, the semiconductor layer disposed on a bottom surface of the light-emitting device 13 may be flip-chip bonded, and the semiconductor layer disposed on a top surface of the light-emitting device 13 may be wire-bonded.

The substrate 11 may be a ceramic substrate which includes single-layered or multi-layered ceramic layers, but the exemplary embodiments are not limited thereto. The substrate 11 may be a conductive substrate or an insulating substrate. In addition, circuit patterns may be printed in the insulating substrate. In some exemplary embodiments, a dielectric constant of the substrate 11 may be lower than a dielectric constant of the dielectric 15D. The substrate 11, the dielectric constant of which is lower than the dielectric constant of the dielectric 15D, may be used for reducing a parasitic capacitance occurring in the substrate 11. However, the exemplary embodiments are not limited thereto. The substrate 11 may be formed using various materials.

Each of the first plate 15P1, the second plate 15P2, the first electrode pad 21A, the second electrode pad 21B, the wiring 22, the third electrode pad 17, and the through-via 19 may include a metal so as to increase electrical conductivity and thermal conductivity, and may include one selected from the group consisting of aluminum (Al), copper (Cu), manganese (Mg), zinc (Zn), titanium (Ti), tantalum (Ta), hafnium (Hf), niobium (Nb), aluminum nitride (AlN), silicon carbide (SiC), and any alloys thereof.

The capacitor 15 may include the dielectric 15D disposed to penetrate the substrate 11, the electrically conductive first plate 15P1 that comes into contact with the top surface TS2 of the dielectric 15D, and the electrically conductive second plate 15P2 that comes into contact with the bottom surface BS2 of the dielectric 15D. Accordingly, the capacitor 15 may be integrally embedded in the substrate 11. The dielectric 15D may include a material, a capacitance of which is reduced according to an increase in a temperature thereof. That is, the dielectric 15D may include a material, a dielectric constant of which is reduced according to an increase in a temperature thereof. In some exemplary embodiments, the dielectric 15D may include titanium oxide ($TiO_2$) or impurity-doped titanium oxide ($TiO_2$). In some exemplary embodiments, the dielectric 15D may include $C_8$ to $C_{20}$ paraffinic hydrocarbons. For example, the dielectric 15D may include at least one selected from the group consisting of hexadecane ($C_{16}$), decane ($C_{10}$), and ocatane ($C_8$).

In some exemplary embodiments, the dielectric 15D may have a single-layered or multi-layered structure. The dielectric 15D may have a multi-layered structure formed of the above-described materials. The materials described above, which may be included in the dielectric 15D, are examples, but the exemplary embodiments are not limited thereto. According to an exemplary embodiment, the dielectric 15D may include any material as long as a dielectric constant of the material is reduced according to an increase in a temperature thereof.

A level of the top surface TS2 of the dielectric 15D may be substantially the same as a level of the top surface TS1 of the substrate 11, and a level of the bottom surface BS2 of the dielectric 15D may be substantially the same as a level of the bottom surface BS1 of the substrate 11. The second plate 15P2 may extend to come into contact with the bottom surface BS2 of the dielectric 15D and the bottom surface BS1 of the substrate 11.

The light-emitting device 13 may be disposed on the substrate 11 that includes the capacitor 15. The light-emitting device 13 may be disposed adjacent to the capacitor 15 so as to transfer heat received by the light-emitting device 13 to the capacitor 15. For example, the light-emitting device 13 may be disposed on the first plate 15P1 to overlap the dielectric 15D in a direction (Y direction) perpendicular to a top surface 13S of the light-emitting device 13. The overlapping structure of the light-emitting device 13 and the capacitor 15 may allow the capacitor 15 to more accurately receive a temperature level of the light-emitting device 13.

Specifically, the temperature of the light-emitting device 13 may increase due to heat generated therein or heat transferred from the outside. The increase in the temperature of the light-emitting device 13 causes an increase in the driving current flowing through the light-emitting device 13. Thus, the light output by the light-emitting device 13 may not be constant and the reliability of the light-emitting device 13 may be deteriorated. Accordingly, it may be necessary to maintain the driving current flowing through the light-emitting device 13 to be constant.

According to an exemplary embodiment, the driving current may be maintained to be constant in such a manner that the light-emitting device 13 is disposed adjacent to the capacitor 15, the capacitance of which is reduced when the temperature thereof increases, and the light emitting device 13 is connected in series with the capacitor 15. The light-emitting device 13 may be disposed adjacent to the capacitor 15 so that the increased temperature of the light-emitting device 13 is transferred to the capacitor 15. That is, the light-emitting device 13 and the capacitor 15 may be disposed to be thermally coupled to each other. When the heat from the light-emitting device 13 is transferred to the capacitor 15 to increase the temperature of the capacitor 15, the dielectric constant of the dielectric 15D constituting the capacitor 15 is reduced and the capacitance of the capacitor 15 is also reduced because the capacitance of the capacitor 15 is proportional to the dielectric constant of the dielectric 15D. Also, since the light-emitting device package 100A is driven by the AC power supply, the impedance of the capacitor 15 is increased due to the reduction in the capacitance of the capacitor 15. Since the capacitor 15 is connected in series with the light-emitting device 13, a total impedance of the light-emitting device package 100A is also increased according to the increase in the impedance of the capacitor 15. Therefore, the increase in the driving current flowing through the light-emitting device package 100A may be suppressed to maintain the driving current constant.

That is, since the increase in the temperature of the light-emitting device 13 may directly influence the capacitor 15 thermally coupled to the light-emitting device 13, it is possible to suppress the increase in the driving current flowing through the light-emitting device package 100A. Therefore, even when the temperature of the light-emitting device package 100A increases, the driving current flowing through the light-emitting device package 100A may be maintained constant, thus stabilizing consumption power and prolonging the lifetime of the light-emitting device 13.

A width L2 of the dielectric 15D is illustrated in FIG. 2 as being slightly wider than a width L1 of the light-emitting device 13 so that the width L1 of the light-emitting device 13 is distinguished from the width L2 of the dielectric 15D. However, the exemplary embodiments are not limited thereto. In some exemplary embodiments, the width L1 of the light-emitting device 13 may be substantially equal to the width L2 of the dielectric 15D.

In addition, a width L3 of the first plate 15P1 is illustrated as being slightly wider than the width L1 of the light-emitting device 13 so that the width L1 of the light-emitting device 13 is distinguished from the width L3 of the first plate 15P1. However, the exemplary embodiments are not limited thereto. In some exemplary embodiments, the width L1 of the light-emitting device 13 may be substantially equal to the width L3 of the first plate 15P1.

The width L2 of the dielectric 15D and the width L3 of the first plate 15P1 may not be excessively wider than the width L1 of the light-emitting device 13. When the width L2 of the dielectric 15D or the width L3 of the first plate 15P1 is not excessively wider than the width L1 of the light-emitting device 13, areas of the first plate 15P1 and the dielectric 15D coming into contact with the other materials, except for areas thereof coming into contact with the light-emitting device 13, may be reduced. Therefore, the dielectric 15D may be less affected by temperatures of the other materials. In order to reduce an influence from the other materials as well as the temperature of the light-emitting device 13, the width L2 of the dielectric 15D and the width L3 of the first plate 15P1 are substantially equal to the width L1 of the light-emitting device 13.

In some exemplary embodiments, the width L2 of the dielectric 15D and the width L3 of the first plate 15P1 may be narrower than the width L1 of the light-emitting device 13. This feature will be described below with reference to FIG. 4. The width L3 of the first plate 15P1 is illustrated in FIG. 2 as being narrower than the width L2 of the dielectric 15D. However, the exemplary embodiments are not limited thereto. The width L3 of the first plate 15P1 may be substantially equal to the width L2 of the dielectric 15D.

The light-emitting device 13 may include a light-emitting diode (LED) chip. The LED chip may emit blue light, green light, red light, or ultraviolet (UV) light according to a type of a compound semiconductor constituting the LED chip. In some exemplary embodiments, the light-emitting device 13 may be one selected from among a UV light diode, a semiconductor laser diode (LD), an organic light-emitting diode (OLED), and a solid laser.

Although not illustrated, the light-emitting device package 100A may further include a wavelength conversion layer that converts a wavelength of light emitted from the light-emitting device 13, a reflection layer that covers a side surface of the light-emitting device 13, or a lens unit that surrounds the light-emitting device 13. In addition, in order to accelerate heat dissipation from the light-emitting device package 100A, the light-emitting device package 100A may further include a heat sink connected to the bottom surface BS1 of the substrate 11 of the light-emitting device package 100A. Although not illustrated, the light-emitting device package 100A may be connected to an external power supply through the second plate 15P2 or the third electrode pad 17, or may be mounted on a printed circuit board (PCB).

Figure 3B:
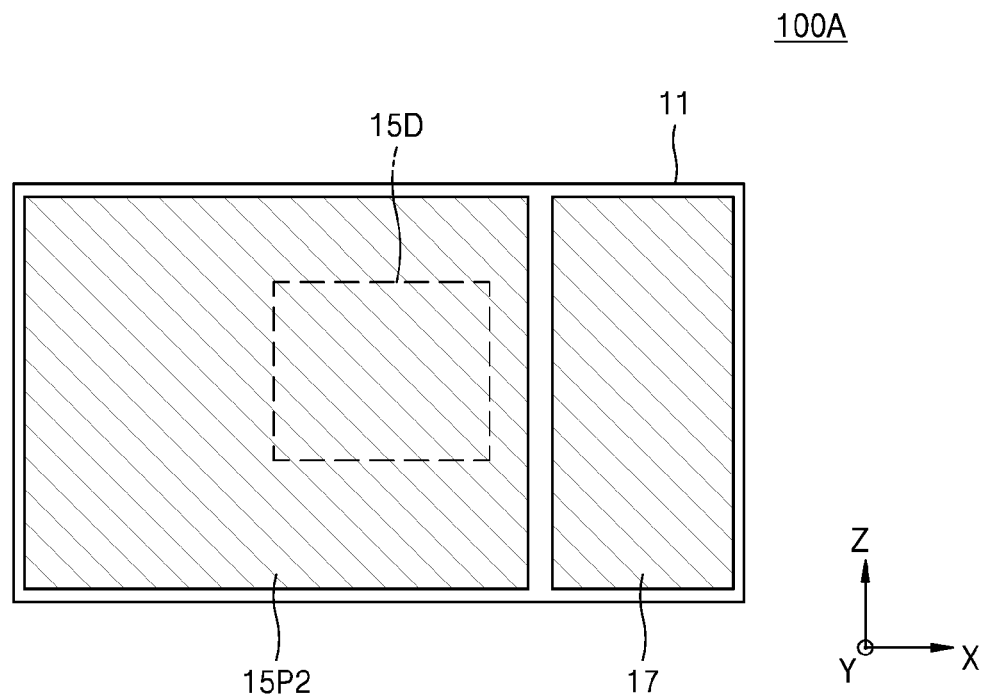

FIGS. 3A and 3B are respectively a plan view and a bottom view of the light-emitting device package 100A of FIG. 2.

Referring to FIGS. 3A and 3B, the dielectric 15D may be disposed in the substrate 11. The first plate 15P1 may be disposed on the dielectric 15D and the light-emitting device 13 may be disposed on the first plate 15P1.

The light-emitting device 13 may be electrically connected through the first wire 23A to the first electrode pad 21A disposed on the substrate 11 and may be electrically connected through the second wire 23B to the second electrode pad 21B disposed on the substrate 11. A driving current, which is transferred to the first electrode pad 21A, may be transferred to the first plate 15P1 through the wiring 22. Although the light-emitting device 13 is disposed on the first plate 15P1, the driving current flowing through the light-emitting device 13 may not be directly transferred to the first plate 15P1.

Since the light-emitting device 13 is disposed on the first plate 15P1, heat of the light-emitting device 13 may be directly transferred to the first plate 15P1. The first plate 15P1, which is disposed adjacent to the light-emitting device 13, may receive heat from the light-emitting device 13 and reach a similar temperature level to the light-emitting device 13. The first plate 15P1 may transfer heat to the dielectric 15D, and the heat may reduce the dielectric constant of the dielectric 15D. The reduction in the dielectric constant of the dielectric 15D may increase the impedance of the capacitor 15 including the dielectric 15D, thus suppressing an increase in a total driving current of the light-emitting device package 100A and maintaining the driving current constant.

In FIG. 3A, the cross-sectional area of the dielectric 15D is illustrated as being larger than the cross-sectional area of the first plate 15P1, and the cross-sectional area of the first plate 15P1 is illustrated as being larger than the cross-sectional area of the light-emitting device 13, so as to distinguish these components from one another. However, the exemplary embodiments are not limited thereto. As described above with reference to FIG. 2, the dielectric 15D, the first plate 15P1, and the light-emitting device 15 may have substantially the same area or other areas altogether.

FIG. 3B illustrates the bottom surface of the light-emitting device package 100A. Referring to FIG. 3B, the substrate 11, the second plate 15P2 and the third electrode pad 17, which come into contact with the bottom surface of the substrate 11, may be disposed on the bottom surface of the light-emitting device package 100A. The second plate 15P2 may extend to cover the bottom surface of the substrate 11 in excess of the cross-sectional area of the dielectric 15D of FIG. 3A. The second plate 15P2 and the third electrode pad 17 may include a conductive material and may perform a similar function to the heat sink that dissipates heat generated by the light-emitting device package 100A.

Figure 4:
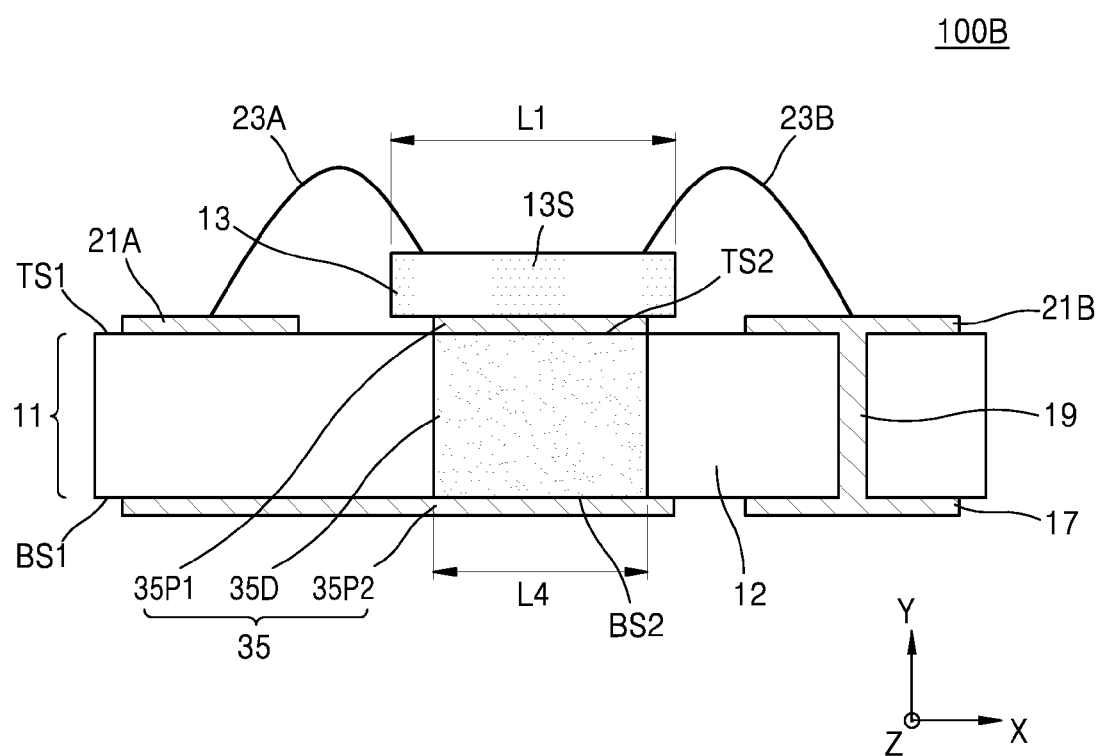
FIG. 4 is a cross-sectional view of a light-emitting device package according to another exemplary embodiment.
Figure 5:
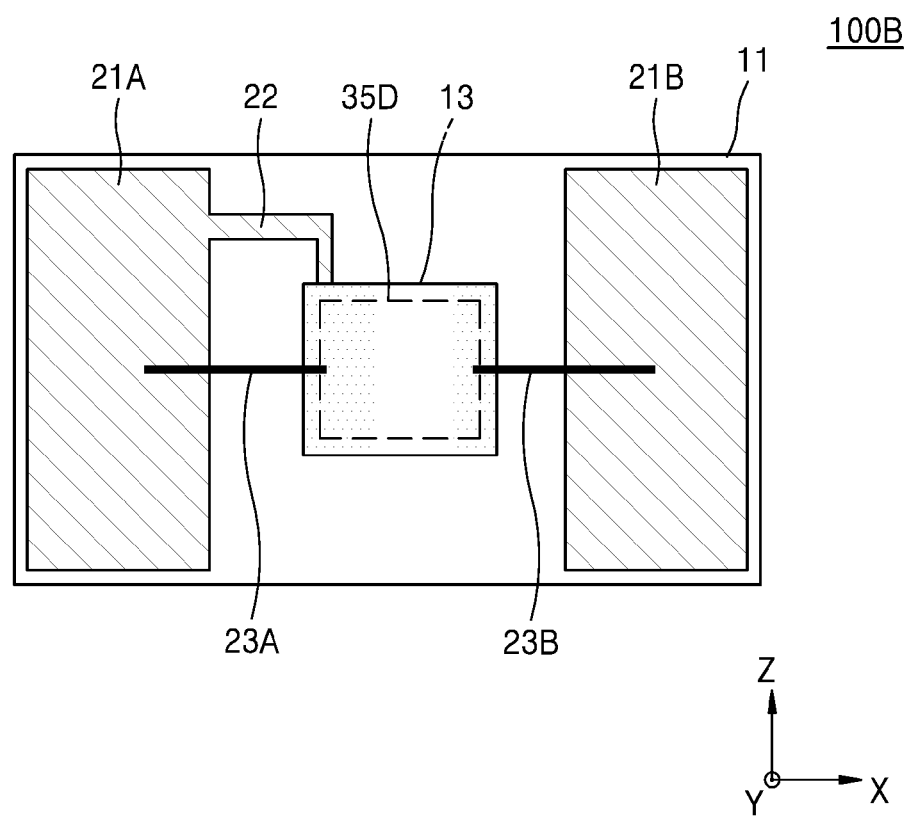
FIG. 5 is a plan view of the light-emitting device package of FIG. 4.

FIGS. 4 and 5 are respectively a plan view and a bottom view of a light-emitting device package 100B according to another exemplary embodiment. The light-emitting device package 100B is substantially similar to the light-emitting device package 100A of FIG. 3B. However, the light-emitting device package 100B differs from the light-emitting device package 100A in that a width L4 of a capacitor 35 is narrower than a width L1 of a light-emitting device 13.

Referring to FIG. 4, the light-emitting device package 100B may include the capacitor 35 embedded therein. The capacitor 35 may include a dielectric 35D that penetrates the substrate 11, a first plate 35P1 disposed on a top surface TS2 of the dielectric 35D, and a second plate 35P2 disposed on a bottom surface BS2 of the dielectric 35D. The light-emitting device 13 may be disposed on the first plate 35P1.

The width L1 of the light-emitting device 13 may be wider than the width L4 of the first plate 35P1 and of the dielectric 35D. Referring to FIG. 5, the first plate 35P1 and the dielectric 35D are indicated by dashed lines because they are covered with the light-emitting device 13.

An overlapping cross-sectional area of the light-emitting device 13 and the dielectric 35D or an overlapping cross-sectional area of the light-emitting device 13 and the first plate 35P1 may be substantially equal to the cross-sectional area of the dielectric 35D and the cross-sectional area of the first plate 35P1. Therefore, the first plate 35P1 may come into contact with the light-emitting device 13 in a +Y direction and the dielectric 35D in a −Y direction, but may not come into contact with other materials. Also, only an infinitesimal area of the first plate 35P1 may come into contact with the other materials in side directions (an X direction and a Z direction). The dielectric 35D may not contact the other materials, except for the first plate 35P1, in the +Y direction.

Accordingly, except that the first plate 35P1 and the dielectric 35D receive heat from the light-emitting device 13, the influence of heat from the other materials may be significantly reduced. Therefore, the dielectric 35D may receive heat proportional to an actual increase in the temperature of the light-emitting device 13 through the first plate 35P1 and the dielectric constant of the dielectric 35D may vary. Accordingly, it is possible to effectively suppress an increase in the total driving current flowing through the light-emitting device package 100B and maintain the driving current constant.

Figure 6:
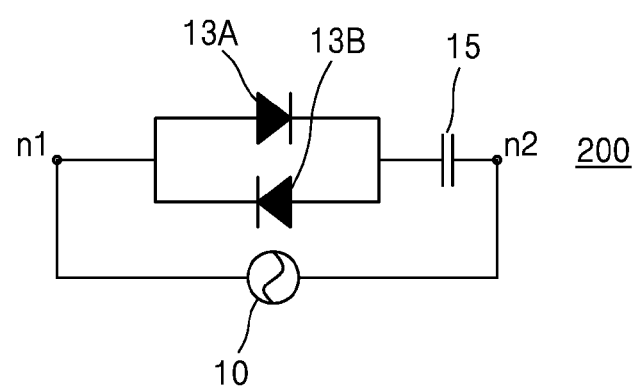
FIG. 6 is a circuit diagram of a light-emitting device package according to another exemplary embodiment.

FIG. 6 is a circuit diagram of a light-emitting device package 200 according to another exemplary embodiment. The light-emitting device package 200 is substantially similar to the light-emitting device package 100 of FIG. 1. However, the light-emitting device package 200 differs from the light-emitting device package 100 in that a first light-emitting device 13A and a second light-emitting device 13B are connected in parallel to each other and are connected in series with a capacitor 15.

Referring to FIG. 6, the light-emitting device package 200 may include the first light-emitting device 13A and the second light-emitting device 13B connected in anti-parallel to each other between a first node n1 and a second node n2, and the capacitor 15 connected in series with the first light-emitting device 13A and the second light-emitting device 13B.

Each of the first and second light-emitting diodes 13A and 13B may be driven by only a current that flows in one direction. Therefore, when one of the first and second light-emitting devices 13A and 13B, or the first and second light-emitting devices 13A and 13B disposed in parallel to each other are driven by an AC power supply 10, the first and second light-emitting devices 13A and 13B may periodically emit no light according to a change in a voltage direction of the AC power supply 10. Therefore, it may be necessary to change directions of driving currents that flow through the first and second light-emitting devices 13A and 13B so that the first and second light-emitting devices 13A and 13B continuously provide light. Accordingly, it may be necessary to include LED drivers that control directions of driving currents of light-emitting devices in a general light-emitting device package.

However, in a case where the first and second light-emitting devices 13A and 13B are connected in anti-parallel to each other as in the light-emitting device package 200 according to the exemplary embodiment shown in FIG. 6, one of the first and second light-emitting devices 13A and 13B may be driven even when the voltage direction of the AC power supply 10 changes. Accordingly, while the light-emitting device package 200 uses the AC power supply 10, the light-emitting device package 200 may continuously provide light, without using any LED drivers that control the direction of the current.

Since the first and second light-emitting devices 13A and 13B, which are connected in anti-parallel to each other, are connected in series with the capacitor 15, it is possible to suppress an increase in the driving currents flowing through the first and second light-emitting devices 13A and 13B if the impedance of the capacitor 15 is reduced according to an increase in the temperature of the capacitor 15. That is, the driving currents, which respectively flow through the first and second light-emitting devices 13A and 13B, may be maintained constant, without being increased.

Figure 7A:
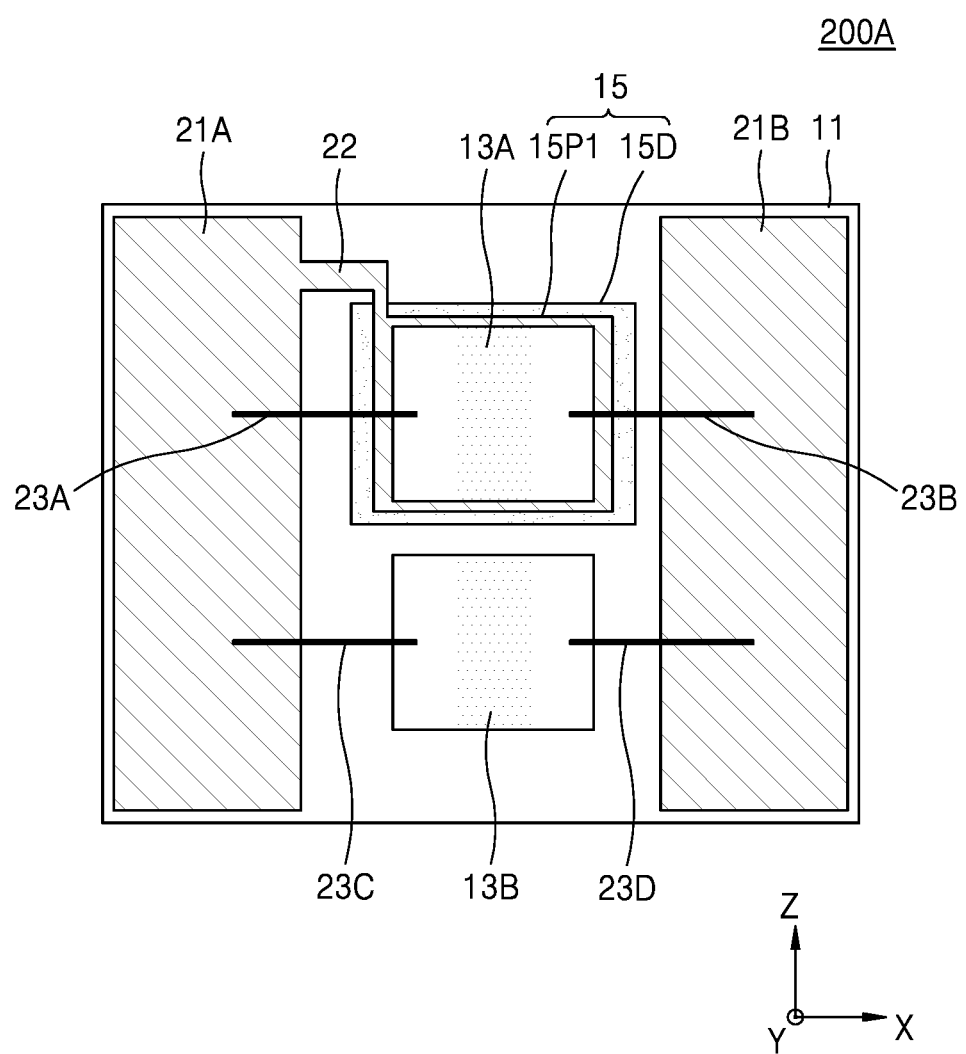
FIGS. 7A and 7B are respectively a plan view and a bottom view of a light-emitting device package according to an exemplary embodiment.
Figure 7B:
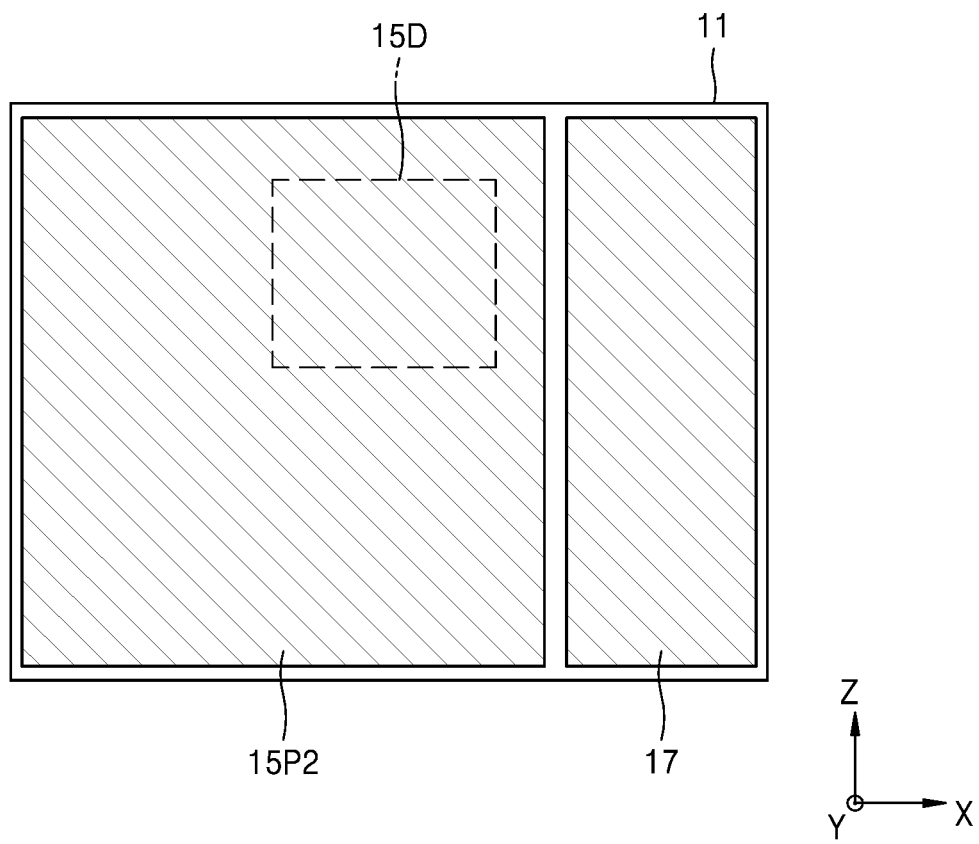
Figure 8A:
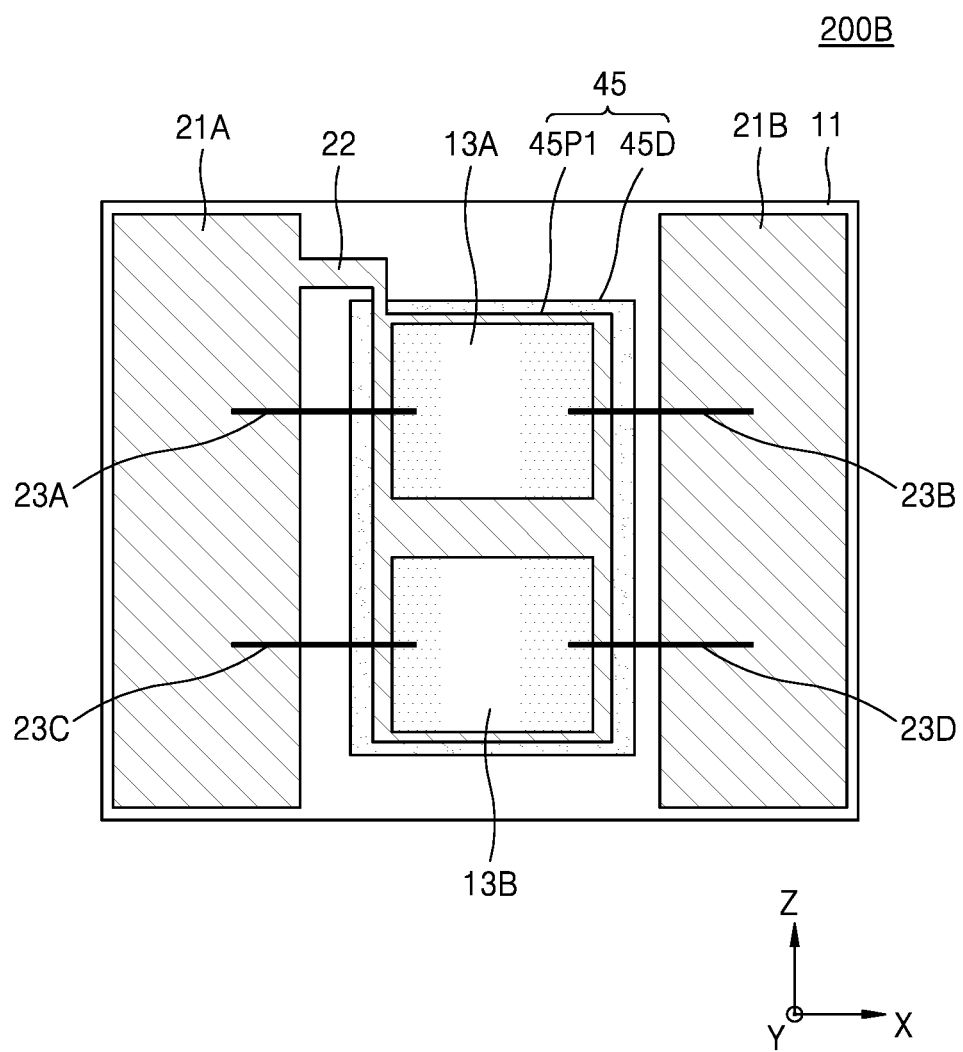
FIGS. 8A and 8B are respectively a plan view and a bottom view of a light-emitting device package according to another exemplary embodiment.
Figure 8B:
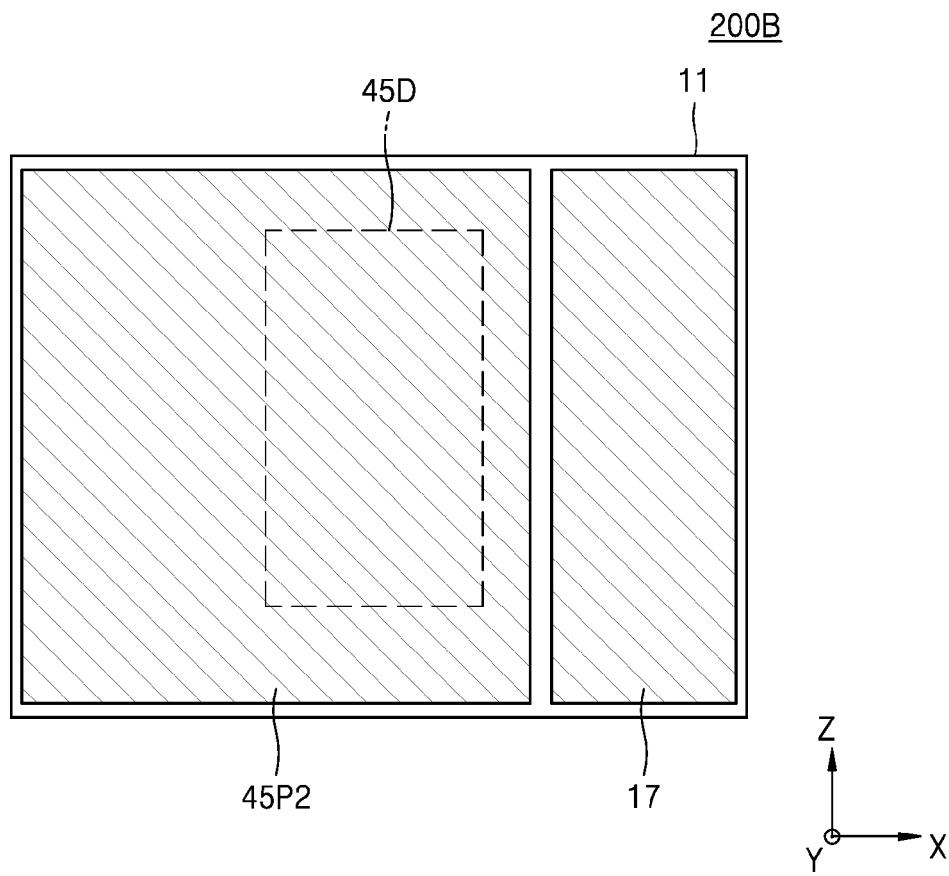

In this case, the capacitor 15 may receive heat generated by the first and second light-emitting devices 13A and 13B through either or both of the first and second light-emitting devices 13A and 13B. FIGS. 7A and 7B illustrate a light-emitting device package 200A in which a capacitor 15 receives heat through a first light-emitting device 13A and controls a driving current. FIGS. 8A and 8B illustrate a light-emitting device package 200B in which a capacitor 45 receives heat through first and second light-emitting devices 13A and 13B and controls a driving current. Detailed descriptions thereof will be provided below with reference to FIGS. 7A to 8B.

In FIG. 6, only two light-emitting devices, that is, the first and second light-emitting devices 13A and 13B, are connected in parallel to each other and are connected in series with the capacitor 15, but the exemplary embodiments are not limited thereto.

In some exemplary embodiments, the light-emitting device package 200 may include three or more light-emitting devices. In this case, at least two of the three or more light-emitting devices may be connected in parallel to each other. For example, the three or more light-emitting devices may be connected in parallel to one another. Also, at least two of the three or more light-emitting devices may be connected in series with each other, and the remaining light-emitting devices may be connected in parallel to one another. In this regard, some exemplary embodiments will be described below with reference to FIG. 11.

Regardless of the series or parallel connection between the plurality of light-emitting devices, at least one of the plurality of light-emitting devices may be disposed to overlap a dielectric constituting the capacitor 15 and provide heat of the light-emitting devices 13A and 13B to the capacitor 15. A description thereof will be provided below with reference to FIGS. 7A and 7B.

FIGS. 7A and 7B are respectively a plan view and a bottom view of the light-emitting device package 200A according to an exemplary embodiment. The light-emitting device package 200A may be an exemplary embodiment of the light-emitting device package 200 of FIG. 6.

Referring to FIG. 7A, a dielectric 15D may be disposed in a substrate 11. A first plate 15P1 may be disposed on the dielectric 15D. A first light-emitting device 13A may be disposed on the first plate 15P1. That is, the first light-emitting device 13A may be disposed to overlap the dielectric 15D. Referring to FIG. 7B, a second plate 15P2 may be disposed on a bottom surface of the dielectric 15D to come into contact with the entire dielectric 15D. The first plate 15P1, the dielectric 15D, and the second plate 15P2 may constitute a capacitor 15.

In addition to the first light-emitting device 13A, a second light-emitting device 13B may be further disposed on the substrate 11. However, the capacitor 15 may not be formed under the second light-emitting device 13B. In this case, the capacitor 15 may receive heat from the first light-emitting device 13A, suppress an increase in the driving current of the light-emitting device package 200A, and maintain the driving current of the light-emitting device package 200A constant. As described above, although the first and second light-emitting devices 13A and 13B are included in the light-emitting device package 200A, it is possible to suppress an increase in the driving current of the light-emitting device package 200A even when heat from any one of the first and second light-emitting devices 13A and 13B is transferred.

As described above with reference to FIG. 6, the first light-emitting device 13A may be electrically connected through a first wire 23A to a first electrode pad 21A disposed on the substrate 11 and may be electrically connected through a second wire 23B to a second electrode pad 21B disposed on the substrate 11. In addition, the second light-emitting device 13B may be electrically connected through a third wire 23C to the first electrode pad 21A and may be electrically connected through a fourth wire 23D to the second electrode pad 21B. Accordingly, the first light-emitting device 13A may be connected in parallel to the second light-emitting device 13B.

A driving current, which is transferred from the first and second light-emitting devices 13A and 13B to the first electrode pad 21A, may be transferred to the first plate 15P1 through a wiring 22. As described above with reference to FIG. 3A, although the first light-emitting device 13A is disposed on the first plate 15P1, the driving current of the first light-emitting device 13A may not be directly transferred from the first light-emitting device 13A to the first plate 15P1.

The first light-emitting device 13A may be disposed on the first plate 15P1 to transfer heat generated by the first light-emitting device 13A to the first plate 15P1.

FIG. 7B illustrates a bottom surface of the light-emitting device package 200A. Referring to FIG. 7B, the substrate 11, the second plate 15P2, and a third electrode pad 17, which come into contact with the bottom surface of the substrate 11, may be disposed on the bottom surface of the light-emitting device package 200A. The second plate 15P2 may extend to cover the bottom surface of the substrate 11 in excess of the cross-sectional area of the dielectric 15D of FIG. 7A. The second plate 15P2 and the third electrode pad 17 may include a conductive material and may perform a similar function to the heat sink that dissipates heat generated by the light-emitting device package 200A.

FIGS. 8A and 8B are respectively a plan view and a bottom view of the light-emitting device package 200B according to another exemplary embodiment. The light-emitting device package 200B may be an exemplary embodiment of the light-emitting device package 200 of FIG. 6. The light-emitting device package 200B is substantially similar to the light-emitting device package 200A of FIGS. 7A and 7B. However, the light-emitting device package 200B differs from the light-emitting device package 200A in that a capacitor 45 receives heat from both a first light-emitting device 13A and a second light-emitting device 13B.

Referring to FIG. 8A, a dielectric 45D may be disposed in a substrate 11 over a relatively wide region, as compared to the dielectric 15D of FIG. 7A. A first plate 45P1, a cross-sectional area of which is substantially similar to a cross-sectional area of the dielectric 45D, may be disposed on the dielectric 45D.

The first and second light-emitting devices 13A and 13B may be disposed on the first plate 45P1. That is, the first and second light-emitting devices 13A and 13B may be disposed to overlap the dielectric 45D. Referring to FIGS. 8A and 8B, a second plate 45P2 may be disposed on a bottom surface of the dielectric 15D to come into contact with the entire dielectric 45D. The first plate 45P1, the dielectric 45D, and the second plate 45P2 may constitute a capacitor 45. The capacitor 45 may receive heat from both the first light-emitting device 13A and the second light-emitting device 13 B. Since an impedance of the capacitor 45 increases due to the received heat, it is possible to suppress an increase in a driving current of the light-emitting device package 200B and maintain the driving current of the light-emitting device package 200B constant.

In a comparison between the light-emitting device package 200B of FIGS. 8A and 8B and the light-emitting device package 200A of FIGS. 7A and 7B, the light-emitting device package 200B is substantially the same as the light-emitting device package 200A in terms of the electrical connection structure, except that a cross-sectional area of the capacitor 45 is expanded so that the capacitor 45 receives heat from the first and second light-emitting devices 13A and 13B.

FIG. 8B illustrates a bottom surface of the light-emitting device package 200B. Referring to FIG. 8B, the substrate 11, and the second plate 45P2 and a third electrode pad 17, which come into contact with the bottom surface of the substrate 11, may be disposed on the bottom surface of the light-emitting device package 200B. The second plate 45P2 may extend to cover the bottom surface of the substrate 11 in excess of the cross-sectional area of the dielectric 45D of FIG. 8A.

In FIGS. 7A to 8B, only the first and second light-emitting devices 13A and 13B are disposed on the substrate 11, but the exemplary embodiments are not limited thereto. In some exemplary embodiments, three or more light-emitting devices may be disposed on the substrate 11. In this case, at least one of the three or more light-emitting devices may be disposed on the first plates 15P1 and 45P1 to overlap the dielectrics 15D and 45D and may be thermally coupled to the dielectrics 15D and 45D to provide heat of the light-emitting devices to the dielectrics 15D and 45D.

Figure 9:
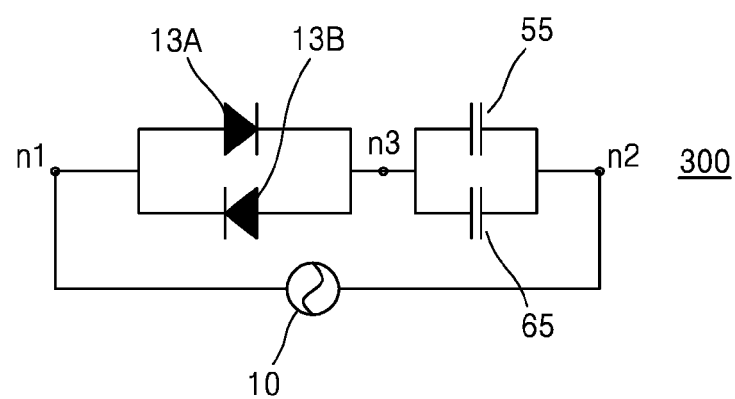
FIG. 9 is a circuit diagram of a light-emitting device package according to another exemplary embodiment.

FIG. 9 is a circuit diagram of a light-emitting device package 300 according to another exemplary embodiment. The light-emitting device package 300 is substantially similar to the light-emitting device package 200 of FIG. 6, except that a capacitor 55 is disposed under a first light-emitting device 13A and a second capacitor 65 is disposed under a second light-emitting device 13B.

Referring to FIG. 9, the light-emitting device package 300 may include the first and second light-emitting devices 13A and 13B that are disposed in anti-parallel to each other between a first node n1 and a third node n3, and the first and second capacitors 55 and 65 that are connected in parallel to each other between the third node n3 and a second node n2.

The first and second light-emitting diodes 13A and 13B, which are connected in parallel to each other, may be connected in series with the first and second capacitors 55 and 65, which are connected in parallel to each other. In addition, the first and second capacitors 55 and 65 may receive heat from the first and second light-emitting devices 13A and 13B, respectively, and more constantly maintain a driving current flowing through the light-emitting device package 300. Specifically, since the impedances of the first and second capacitors 55 and 65, which receive heat from the first and second light-emitting devices 13A and 13B, respectively, increase, a total impedance of the light-emitting device package 300 may increase, thus maintaining the driving current of the light-emitting device package 300 to be constant.

Only the first and second light-emitting devices 13A and 13B and the first and second capacitors 55 and 65 are illustrated in FIG. 9, but the exemplary embodiments are not limited thereto. In some exemplary embodiments, the light-emitting device package 300 may include three or more light-emitting devices, and at least one capacitor that receives heat from at least one of the three or more light-emitting devices.

Figure 10A:
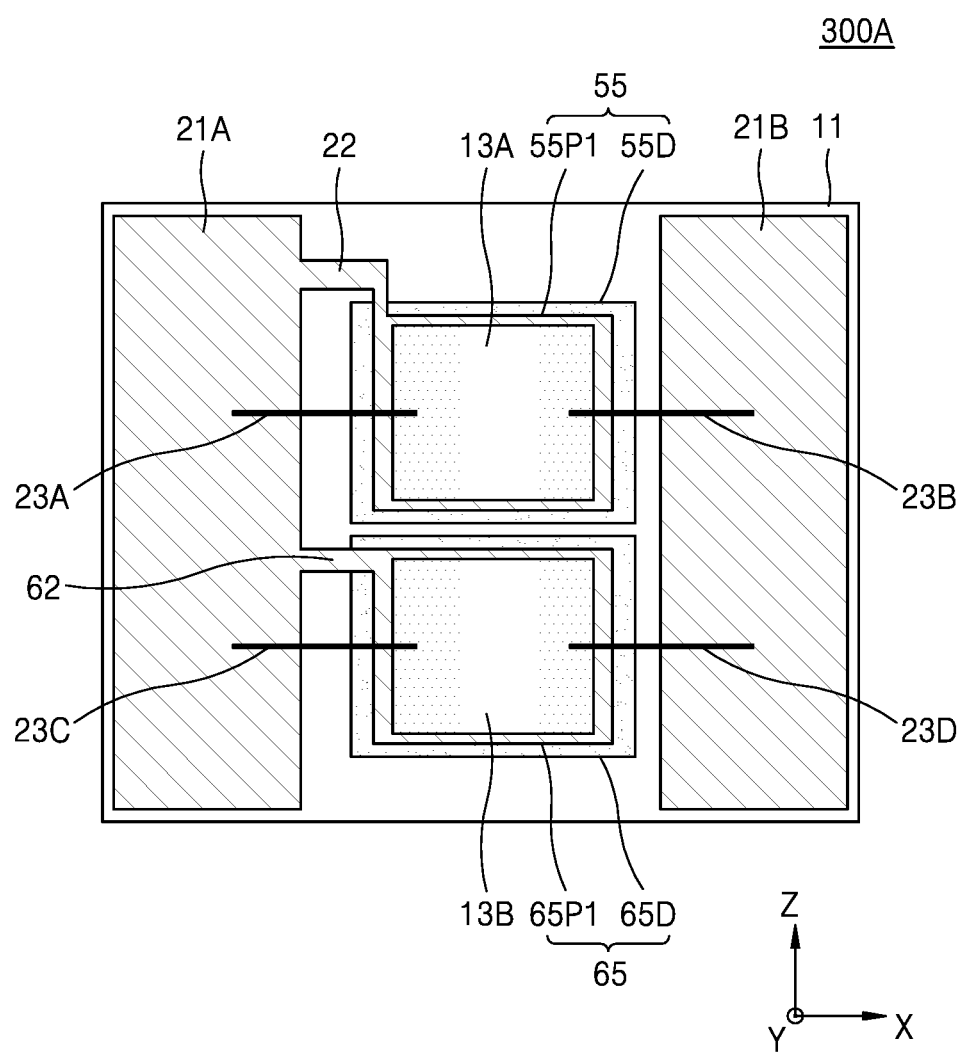
FIGS. 10A and 10B are respectively a plan view and a bottom view of a light-emitting device package according to an exemplary embodiment.
Figure 10B:
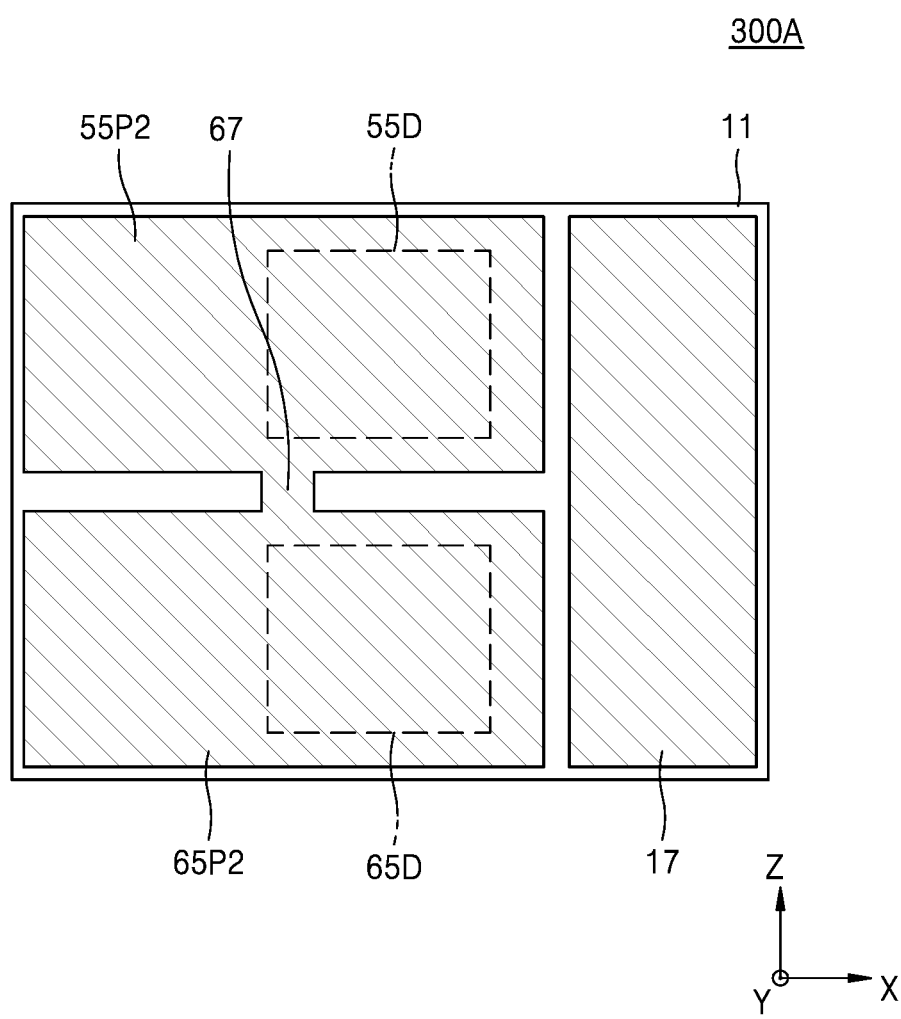

FIGS. 10A and 10B are respectively a plan view and a bottom view of a light-emitting device package 300A according to an exemplary embodiment. The light-emitting device package 300A may be an exemplary embodiment of the light-emitting device package 300 of FIG. 9. The light-emitting device package 300A is substantially similar to the light-emitting device package 200A of FIGS. 7A and 7B. However, the light-emitting device package 300A differs from the light-emitting device package 200A in that first and second capacitors 55 and 65 are disposed under first and second light-emitting devices 13A and 13B, respectively.

Referring to FIG. 10A, first and second dielectrics 55D and 65D may be disposed in a substrate 11. First and third plates 55P1 and 65P1, cross-sectional areas of which are substantially similar to cross-sectional areas of the first and second dielectrics 55D and 65D, may be disposed on the first and second dielectrics 55D and 65D, respectively. The first and second light-emitting devices 13A and 13B may be disposed on the first and third plates 55P1 and 65P1, respectively. That is, the first and second light-emitting devices 13A and 13B may be disposed to overlap the first and second dielectrics 55D and 65D, respectively.

Referring to FIG. 10B, a second plate 55P2 may be disposed on a bottom surface of the first dielectric 55D to overlap the entire first dielectric 55D, and a fourth plate 65P2 may be disposed on a bottom surface of the second dielectric 65D to overlap the entire second dielectric 65D. The first plate 55P1, the first dielectric 55D, and the second plate 55P2 may constitute the first capacitor 55, and the third plate 65P1, the second dielectric 65D, and the fourth plate 65P2 may constitute the second capacitor 65.

The first capacitor 55 may receive heat from the first light-emitting device 13A, and the second capacitor 65 may receive heat from the second light-emitting device 13B. The impedances of the first and second capacitors 55 and 65 may increase due to the received heat, thus suppressing an increase in a driving current of the light-emitting device package 300A and maintaining the driving current of the light-emitting device package 300A to be constant.

In a comparison between the light-emitting device package 300A of FIGS. 10A and 10B and the light-emitting device package 200A of FIGS. 7A and 7B, the light-emitting device package 300A is substantially similar to the light-emitting device package 200A in terms of the electrical connection structure, except that the second capacitor 65 is disposed under the second light-emitting device 13B so that the second capacitor 65 as well as the first capacitor 55 receives heat through the second light-emitting device 13B. However, the first capacitor 55 is connected in parallel to the second capacitor 65.

Referring to FIGS. 9, 10A, and 10B, the first and second light-emitting devices 55 and 65 are connected in parallel to each other between a first node n1 and a third node n3. Specifically, a third electrode pad 17, a through-via, a second electrode pad 21B, second and fourth wires 23B and 23D, the first and second light-emitting devices 13A and 13B connected in parallel to each other, first and third wires 23A and 23C, and a first electrode pad 21A may be disposed between the first node n1 and the third node n3. The via-hole may be connected to the third electrode pad 17, penetrate the substrate 11, and be connected to the second electrode pad 21B.

The first and second capacitors 55 and 65 may be connected in parallel to each other between the third node n3 and a second node n2. Specifically, the first electrode pad 21A, first and second wirings 22 and 62, the first and second capacitors 55 and 65 connected in parallel to each other, and a third wiring 67 may be disposed between the third node n3 and the second node n2. That is, the first and second capacitors 55 and 65 may share the first electrode pad 21A and the third wiring 67 of FIG. 10B as both nodes.

FIG. 10B illustrates a bottom surface of the light-emitting device package 300A. Referring to FIG. 10B, the substrate 11, and the second plate 55P2 and the fourth plate 65P2, which come into contact with the bottom surface of the substrate 11, may be disposed on the bottom surface of the light-emitting device package 300A. The second and fourth plates 55P2 and 65P2 may extend to the bottom surface of the substrate 11 in excess of the cross-sectional area of the first and second dielectrics 55D and 65D of FIG. 10A.

Two light-emitting devices, that is, the first and second light-emitting devices 13A and 13B, and two capacitors, that is, the first and second capacitors 55 and 65, are illustrated in FIGS. 10A and 10B, but the exemplary embodiments are not limited thereto. The light-emitting device package 300A may include three or more light-emitting devices and three or more capacitors. The plurality of light-emitting devices may be disposed to overlap the plurality of capacitors, respectively.

Figure 11:
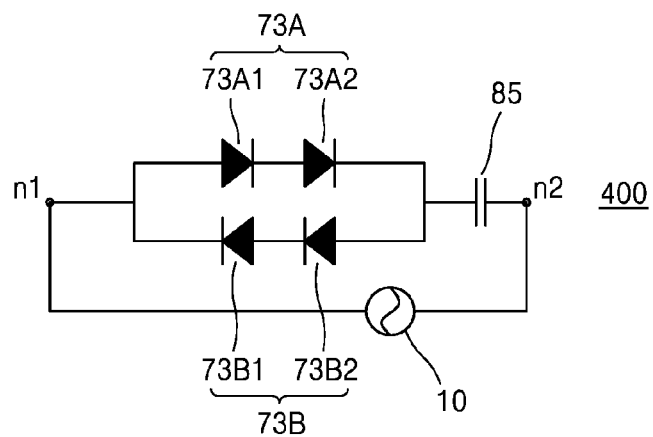
FIG. 11 is a circuit diagram of a light-emitting device package according to another exemplary embodiment.

FIG. 11 is a circuit diagram of a light-emitting device package 400 according to another exemplary embodiment. The light-emitting device package 400 of FIG. 11 is substantially similar to the light-emitting device package 200, except that a first light-emitting device group 73A including first and third light-emitting devices 73A1 and 73A2 connected in series with each other is connected in parallel to a second light-emitting device group 73B including second and fourth light-emitting devices 73B1 and 73B2 connected in series with each other.

Referring to FIG. 11, the first light-emitting device group 73A may include the first and third light-emitting devices 73A1 and 73A2 connected in series with each other, and the second light-emitting device group 73B may include the second and fourth light-emitting devices 73B 1 and 73B2 connected in series with each other. The first light-emitting device group 73A may be connected in anti-parallel to the second light-emitting device group 73B between the first node n1 and the second node n2. The first and second light-emitting device groups 73A and 73B may be connected in series with a capacitor 85. Due to the plurality of light-emitting devices connected in series with one another, the light-emitting device package 400 may improve light output.

Figure 12:
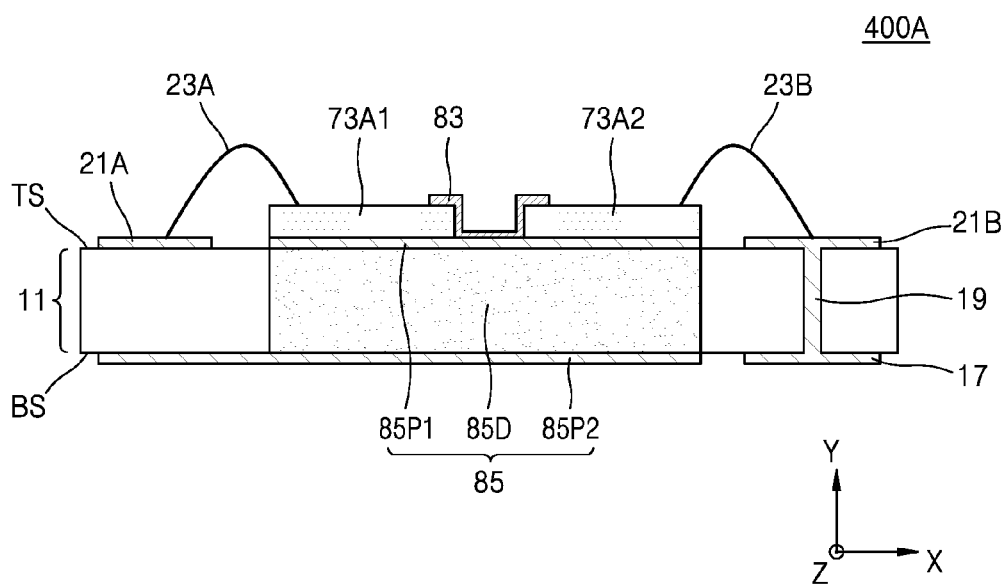
FIG. 12 is a cross-sectional view of a light-emitting device package according to an exemplary embodiment.
Figure 13A:
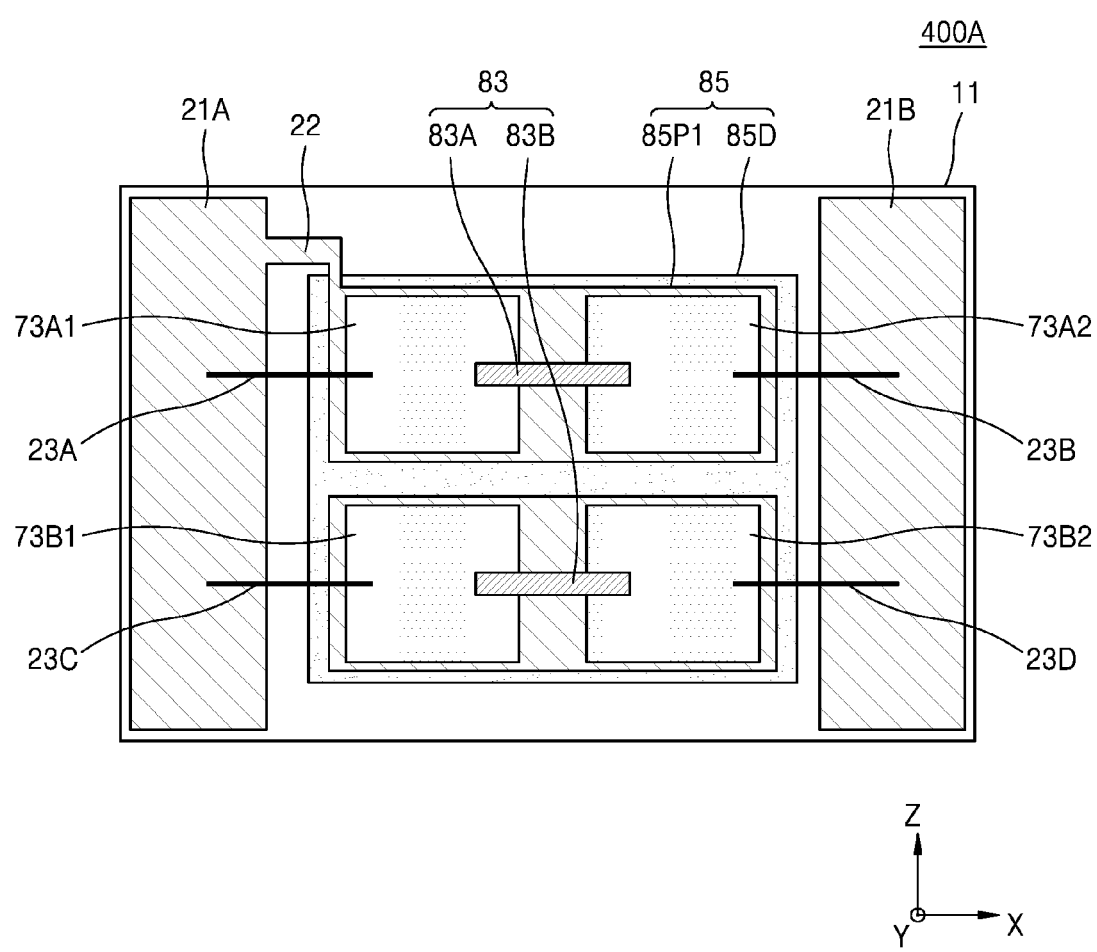
FIGS. 13A and 13B are respectively a plan view and a bottom view of the light-emitting device package of FIG. 12.
Figure 13B:
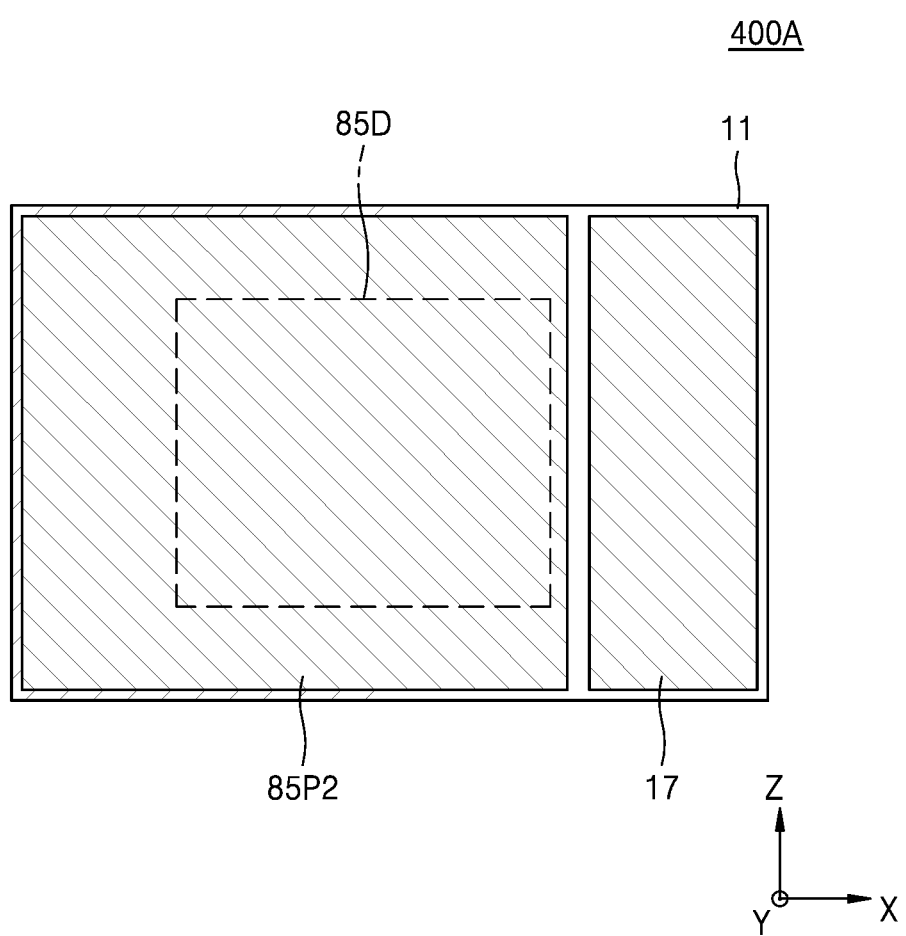

FIG. 12 is a cross-sectional view of a light-emitting device package 400A according to an exemplary embodiment, and FIGS. 13A and 13B are respectively a plan view and a bottom view of the light-emitting device package 400A of FIG. 12. The light-emitting device package 400A may be an exemplary embodiment of the light-emitting device package 400 of FIG. 11.

Referring to FIGS. 12, 13A, and 13B, a dielectric 85D may be disposed in a substrate 11 over a relatively wide region. A first plate 85P1, a cross-sectional area of which is substantially similar to a cross-sectional area of the dielectric 85D, may be disposed on the dielectric 85D. A first light-emitting device 73A1, a second light-emitting device 73B1, a third light-emitting device 73A2, and a fourth light-emitting device 73B2 may be disposed on the first plate 85P1. That is, the first to fourth light-emitting devices 73A1 to 73B2 may be disposed to overlap the dielectric 85D. A second plate 85P2 may be disposed on a bottom surface of the dielectric 85D to come into contact with the entire dielectric 85D. The first plate 85P1, the dielectric 85D, and the second plate 85P2 may constitute a capacitor 85.

The capacitor 85 may receive heat from all of the first to fourth light-emitting devices 73A1, 73A2, 73B1, and 73B2. An impedance of the capacitor 85 may increase due to the received heat, thus suppressing an increase in a driving current of the light-emitting device package 400A and maintaining the driving current of the light-emitting device package 400A to be constant.

The first light-emitting device 73A1 may be connected in series with the third light-emitting device 73A2 through a first connection part 83A, and the second light-emitting device 73B1 may be connected in series with the fourth light-emitting device 73B2 through a second connection part 83B.

FIG. 13B illustrates a bottom surface of the light-emitting device package 400A. Referring to FIG. 13B, the substrate 11, and the second plate 85P2 and a third electrode pad 17, which come into contact with a bottom surface of the substrate 11, may be disposed on the bottom surface of the light-emitting device package 400A. The second plate 85P2 may extend to cover the bottom surface of the substrate 11 in excess of the cross-sectional area of the dielectric 85D of FIG. 13A.

In FIGS. 13A and 13B, the capacitor 85 is widely formed to overlap all the first to fourth light-emitting devices 73A1, 73A2, 73B1, and 73B2, but the exemplary embodiments are not limited thereto. The capacitor 85 may be disposed to overlap at least one of the first to fourth light-emitting devices 73A1, 73A2, 73B1, and 73B2 and receive heat from the at least one of the first to fourth light-emitting devices 73A1, 73A2, 73B 1, and 73B2.

Figure 14:
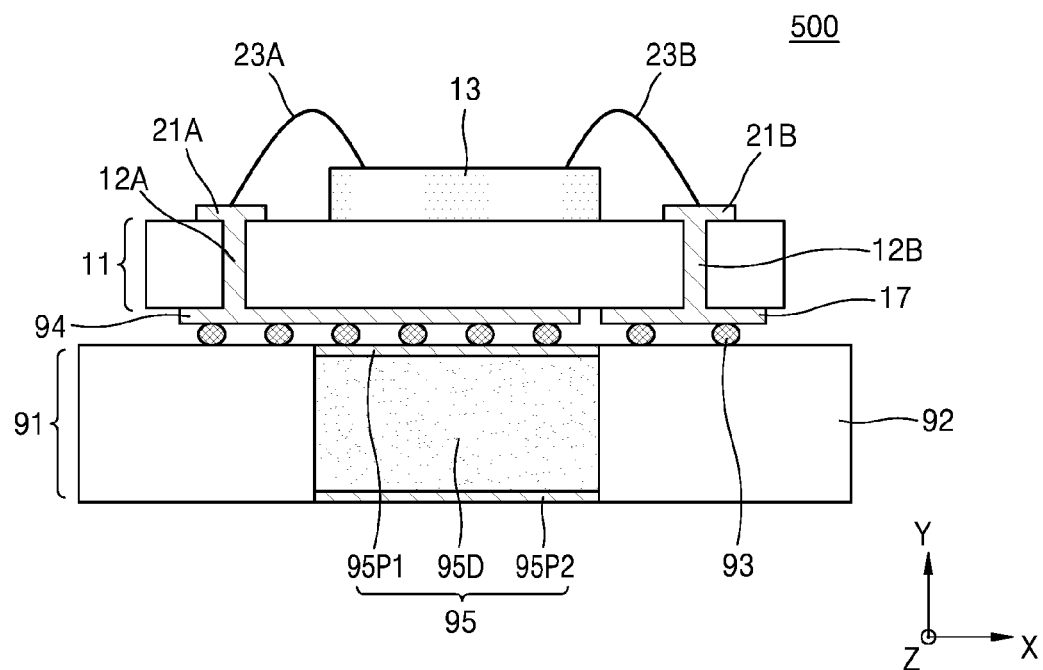
FIG. 14 is a cross-sectional view of an electronic device according to an exemplary embodiment.

FIG. 14 is a cross-sectional view of an electronic device 500 according to an exemplary embodiment.

Referring to FIG. 14, the electronic device 500 may include a board substrate 91, a light-emitting device package, and a capacitor 95. The light-emitting device package may be disposed on the board substrate 91 and include a light-emitting device 13 driven by an AC power supply. The capacitor 95 may be connected in series with the light-emitting device 13, and a capacitance of the capacitor 95 may be reduced according to an increase in a temperature thereof.

The light-emitting device package may include a substrate 11, the light-emitting device 13 disposed on the substrate 11, and wires 23A and 23B that electrically connect the light-emitting device 13 to outside the light-emitting device package, through-vias 12A and 12B, and electrode pads 17, 21A, 21B, and 94. The light-emitting device package may be supported by the capacitor 95, which is embedded in the board substrate 91, and a connection member, for example, a solder ball 93, which is formed on the board substrate 91.

The board substrate 91 may be a capacitor-embedded PCB substrate and may be embedded with wirings and elements for the electronic device 500. In addition to the light-emitting device package, various elements for the electronic device 500 may be disposed on the board substrate 91.

The capacitor 95 may include a dielectric 95D that penetrates the substrate 91, a first plate 95P1 that comes into contact with a top surface of the dielectric 95D, and a second plate 95P2 that comes into contact with a bottom surface of the dielectric 95D. The light-emitting device package, which is supported by the solder ball 93, may be disposed on a top surface of the first plate 95P1.

The capacitor 95 may be disposed adjacent to the light-emitting device 13, in which heat is mostly generated, so as to receive heat generated from the light-emitting device package. Therefore, the light-emitting device package may be disposed such that the light-emitting device 13 overlaps the capacitor 95 in a direction (Y direction) perpendicular to a principal surface of the board substrate 91. The overlapping structure of the light-emitting device 13 and the capacitor 95 may allow the capacitor 95 to receive a more accurate temperature of the light-emitting device 13. When the heat from the light-emitting device 13 is transferred to the capacitor 95, a temperature of the capacitor 95 increases and an impedance of the capacitor 95 increases accordingly, thus suppressing an increase in a driving current flowing through the light-emitting device package and maintaining the driving current flowing through the light-emitting device package to be constant.

Figure 15:
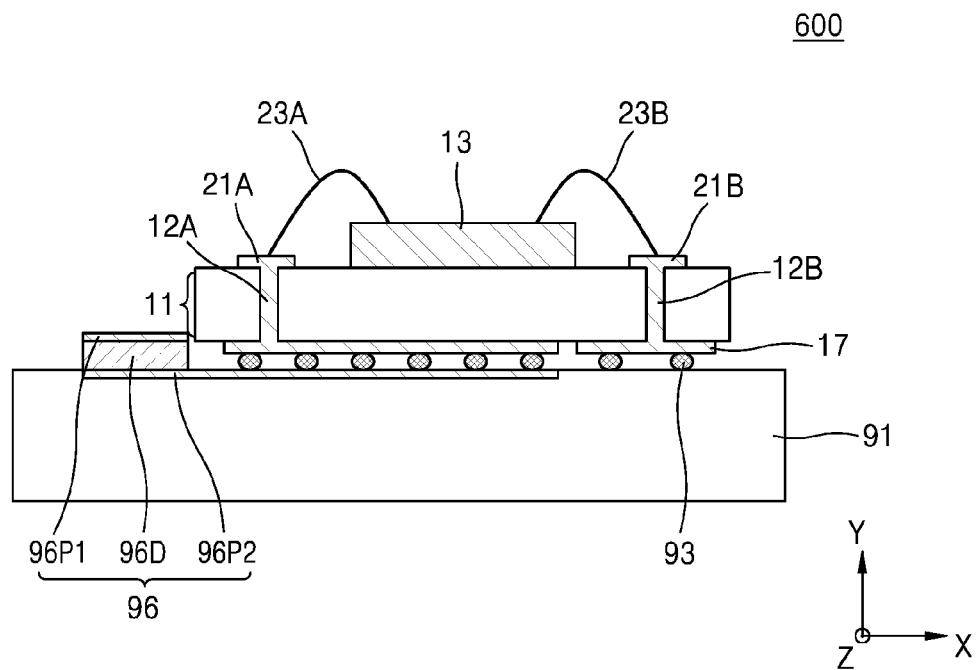
FIG. 15 is a cross-sectional view of an electronic device according to another exemplary embodiment.

FIG. 15 is a cross-sectional view of an electronic device 600 according to another exemplary embodiment. The electronic device 600 is substantially similar to the electronic device 500 of FIG. 14. However, the electronic device 600 differs from the electronic device 500 in that a capacitor 96 is not embedded in a board substrate 91 but is disposed on the board substrate 91.

Referring to FIG. 15, the electronic device 600 may include the board substrate 91, a light-emitting device package, and the capacitor 96. The light-emitting device package may include a light-emitting device 13 disposed on the board substrate 91 and may be driven by an AC power supply. The capacitor 96 may be connected in series with the light-emitting device 13 and may be disposed in parallel with the light-emitting device 13 on the board substrate 91. A capacitance of the capacitor 96 may be reduced according to an increase in a temperature thereof. The light-emitting device package may be supported by a connection member, for example, a solder ball 93, which is formed on the board substrate 11.

The capacitor 96 may be disposed adjacent to a side surface (X direction) of the light-emitting device package on the board substrate 91. The capacitor 96 may include a second plate 96P2 disposed on the board substrate 91, a dielectric 96D disposed on the second plate 95P2, and a first plate 96P1 disposed on the dielectric 96D. The second plate 96P2 may widely extend along a top surface of the board substrate 91 so as to overlap the light-emitting device 13 of the light-emitting device package in a direction (Y direction) perpendicular to a principal surface of the board substrate 91.

Heat from the light-emitting device 13 may be transferred to the second plate 96P2 through electrode pads 17, 21A, 21B, and 94, through-electrodes 12A and 12B, and the solder ball 93. The second plate 96P2 may transfer heat to the dielectric 96D. When the heat from the light-emitting device 13 is transferred to the capacitor 96, a temperature of the capacitor 96 increases and an impedance of the capacitor 96 increases accordingly, thus suppressing an increase in a driving current flowing through the light-emitting device package and maintaining the driving current flowing through the light-emitting device package to be constant.

Figure 16:
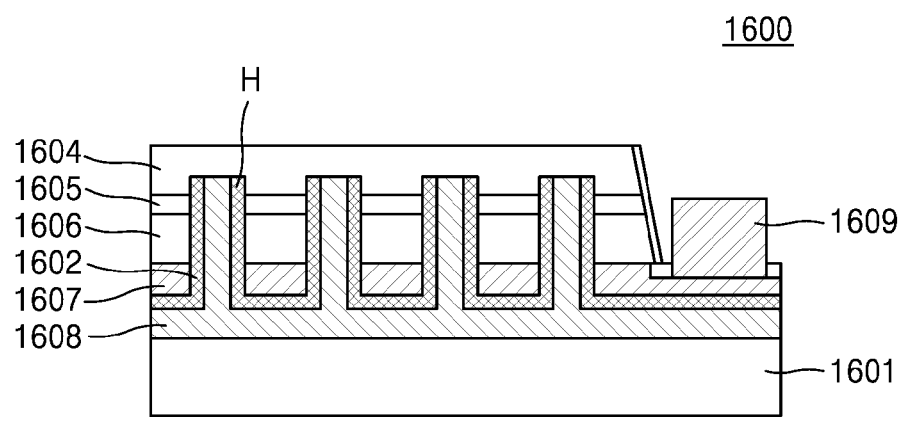
FIG. 16 is a side cross-sectional view of a light-emitting diode (LED) chip that may be included in a light-emitting device package and an electronic device, according to an exemplary embodiment.

FIG. 16 is a side cross-sectional view of an LED chip 1600 that may be included in a light-emitting device package and an electronic device, according to an exemplary embodiment. The LED chip 1600 may be any one of the light-emitting devices 13, 13A, and 13B included in the light-emitting device packages 100, 100A, 100B, 200, 200A, 200B, 300, 300A, 400, and 400A described above with reference to FIGS. 1 to 13B, or may be any one of the light-emitting devices 13 included in the electronic devices 500 and 600 described above with reference to FIGS. 14 and 15. When a large high-power light-emitting device chip for illumination is manufactured, the LED chip 1600 may be used for improving current spreading efficiency and heat dissipation efficiency.

Referring to FIG. 16, the LED chip 1600 may have a stack structure including a first-conductivity-type semiconductor layer 1604, an active layer 1605, a second-conductivity-type semiconductor layer 1606, a second electrode layer 1607, an insulating layer 1602, a first electrode layer 1608, and a substrate 1601. At this time, the first electrode layer 1608 may include one or more contact holes H that are electrically insulated from the second-conductivity-type semiconductor layer 1606 and the active layer 1605 and extend from one surface of the first electrode layer 1608 to at least a portion of the first-conductivity-type semiconductor layer 1604, so as to be electrically connected to the first-conductivity-type semiconductor layer 1604. In the present exemplary embodiment, the first electrode layer 1608 may not be an essential element.

The contact holes H may extend from an interface of the first electrode layer 1608 to the inside of the first-conductivity-type semiconductor layer 1604 through the second electrode layer 1607, the second-conductivity-type semiconductor layer 1606, and the active layer 1605. The contact holes H may extend to an interface of at least the active layer 105 and the first-conductivity-type semiconductor layer 1604, and may extend to a portion of the first-conductivity-type semiconductor layer 1604. On the other hand, since the contact holes H are provided for electrical connection and the current spreading of the first-conductivity-type semiconductor layer 1604, the purpose of the contact holes H may be achieved as long as the contact holes H come into contact with the first-conductivity-type semiconductor layer 1604. Thus, the contact holes H need not extend to an outer surface of the first-conductivity-type semiconductor layer 1604.

By taking into account a light reflection function and an ohmic contact function with respect to the second-conductivity-type semiconductor layer 1606, the second electrode layer 1607, which is disposed on the second-conductivity-type semiconductor layer 1606, may include one selected from the group consisting of silver (Ag), nickel (Ni), aluminum (Al), rhodium (Rh), palladium (Pd), iridium (Jr), ruthenium (Ru), manganese (Mg), zinc (Zc), platinum (Pt), and gold (A). The second electrode layer 1607 may be formed through a sputtering process or a deposition process.

The contact holes H may penetrate the second electrode layer 1607, the second-conductivity-type semiconductor layer 1606, and the active layer 1605 so as to be connected to the first-conductivity-type semiconductor layer 1604. The contact holes H may be formed through an etching process, for example, inductively coupled plasma-reactive ion etching (ICP-RIE).

The insulating layer 1602 may be disposed to cover sidewalls of the contact holes H and a surface of the second-conductivity-type semiconductor layer 1606. In this case, at least a portion of the first-conductivity-type semiconductor layer 1604, which corresponds to bottoms of the contact holes H, may be exposed. The insulating layer 1602 may be formed by depositing an insulating material such as $SiO_2$, $SiO_xN_y$, and $Si_xN_y$.

The second electrode layer 1607 may include vias formed by filling the contact holes H with a conductive material. A plurality of vias may be formed in one light-emitting device region. The number of vias and the contact area of the vias may be adjusted such that an area occupied on a plane by a region where the plurality of vias come into contact with a first-conductivity-type semiconductor of the first-conductivity-type semiconductor layer 1604 ranges from about 0.5% to about 20% of an area of the light-emitting device region.

The substrate 1601 may be disposed on the first electrode layer 1608. In such a structure, the substrate 1601 may be electrically connected to the first electrode layer 1608 through the conductive vias connected to the first-conductivity-type semiconductor layer 1604.

The substrate 1601 may include one selected from the group consisting of gold (Au), nickel (Ni), aluminium (Al), copper (Cu), tungsten (W), silicon (Si), selenium (Se), gallium arsenide (GaAs), silicon aluminium (SiAl), geranium (Ge), silicon carbide (SiC), aluminium nitride (AlN), aluminium oxide ($Al_2O_3$), gallium nitride (GaN), and aluminium gallium nitride (AlGaN). The substrate 1601 may be formed through a plating process, a sputtering process, a deposition process, or an attaching process. However, the material and the forming method of the substrate 1601 are not limited to these types of processes.

The number, the shape, and the pitch of the contact holes H, and the contact area of the contact holes H with the first-conductivity-type and second-conductivity-type semiconductor layer 1604 and 1606 may be appropriately adjusted so as to reduce a contact resistance. In addition, the contact holes H may be arranged in various shapes along rows and columns so as to improve a current flow.

Figure 17:
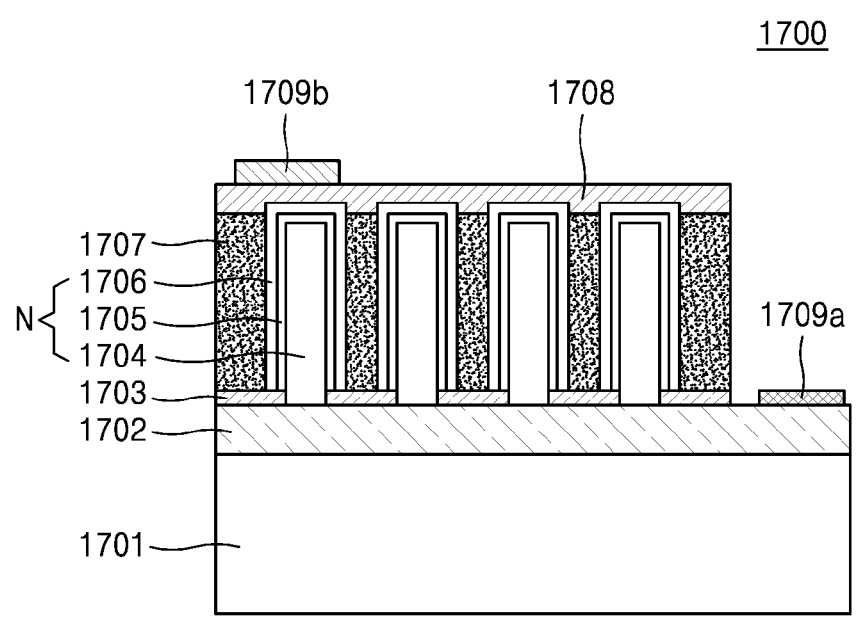
FIG. 17 is a side cross-sectional view of an LED chip that may be included in a light-emitting device package and an electronic device, according to another exemplary embodiment.

FIG. 17 is a side cross-sectional view of an LED chip 1700 that may be included in a light-emitting device package and an electronic device, according to another exemplary embodiment. The LED chip 1700 may be any one of the light-emitting devices 13, 13A, and 13B included in the light-emitting device packages 100, 100A, 100B, 200, 200A, 200B, 300, 300A, 400, and 400A described above with reference to FIGS. 1 to 13B, or may be any one of the light-emitting devices 13 included in the electronic devices 500 and 600 described above with reference to FIGS. 14 and 15.

A lighting apparatus, which uses the LED chip, may provide improved dissipation characteristics. However, in terms of an entire heat dissipation performance, the lighting apparatus may use an LED chip having a low heating value. Examples of the LED chip that satisfies the above-described condition may include an LED chip having a nano structure (hereinafter, referred to as a nano LED chip). Examples of the nano LED chip may include a core type nano LED chip and a shell type nano LED chip. In particular, since the nano LED chip has a low bonding density, the nano LED chip generates relatively less heat. In addition, a light-emitting area may be expanded using the nano structure, thus improving luminous efficiency of the nano LED chip. Furthermore, since a non-polar active layer may be obtained, it is possible to prevent efficiency reduction caused by polarization and improve droop characteristics.

Referring to FIG. 17, the nano LED chip 1700 may have a plurality of nano light-emitting structures N formed on a substrate 1701. In the present exemplary embodiment, the nano light-emitting structures N are illustrated as having a rod structure as a core-shell structure, but the exemplary embodiments are not limited thereto. The nano light-emitting structures N may have other structures such as a pyramid structure.

The nano LED chip 1700 may include a base layer 1702 disposed on the substrate 1701. The base layer 1702 may provide growth surfaces of the nano light-emitting structures N. The base layer 1702 may be a first-conductivity-type semiconductor. A mask layer 1703, which has an open region for the growth of the nano light-emitting structures N (in particular, cores), may be disposed on the base layer 1702. The mask layer 1703 may include a dielectric material such as $SiO_2$ or $SiN_x$.

In the nano light-emitting structures N, first-conductivity-type nano cores 1704 may be formed by selectively growing the first-conductivity-type semiconductor by using the mask layer 1703 having the open region. An active layer 1705 and a second-conductivity-type semiconductor layer 1706 may be formed as a shell layer on surfaces of the first-conductivity-type nano cores 1704. Therefore, the nano light-emitting structures N may have a core-shell structure in which the first-conductivity-type semiconductor becomes the first-conductivity-type nano cores 1704, and the active layer 1705 and the second-conductivity-type semiconductor layer 1706, which surround the first-conductivity-type nano core 1704, become the shell layer.

The nano LED chip 1700 may include a filling material 1707 filling a gap between the nano light-emitting structures N. The filling material 1707 may structurally stabilize the nano light-emitting structures N. The filling material 1707 may include a transparent material such as $SiO_2$, but is not limited thereto. An ohmic contact layer 1708 may be disposed on the nano light-emitting structures N so as to be connected to the second-conductivity-type semiconductor layer 1706. The nano LED chip 1700 may include first and second electrodes 1709a and 1709b that are respectively connected to the base layer 1702 and the ohmic contact layer 1708.

A single device may emit two or more light beams having different wavelengths by changing the diameter, component, or doping concentration of the nano light-emitting structures N. White light may be realized in the single device, without using any phosphors, by adjusting the light beams having the different wavelengths. In addition, light beams having various colors or white light having different color temperatures may be realized by combining other LED chips or wavelength conversion materials, such as phosphors, with the single device.

Figure 18:
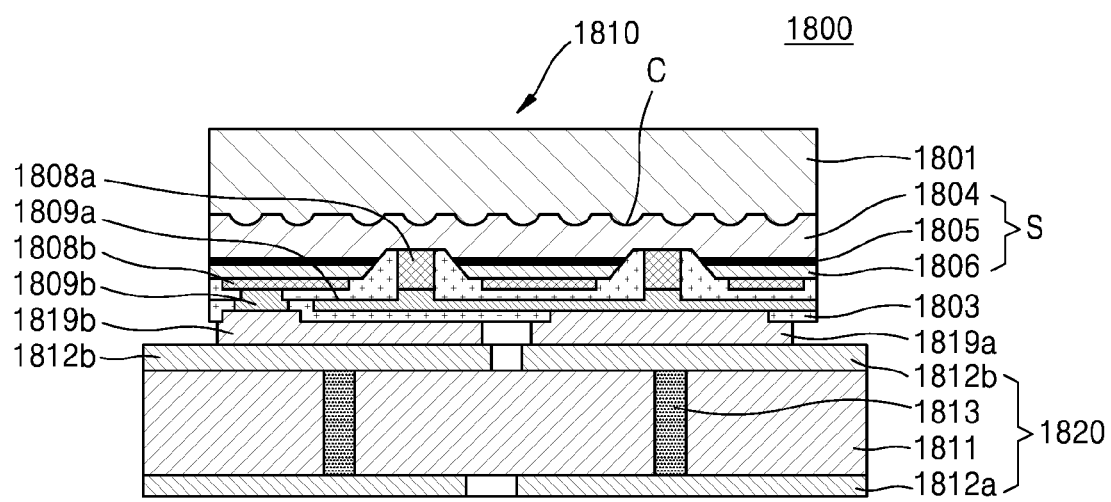
FIG. 18 is a side cross-sectional view of a light-emitting device that may be included in a light-emitting device package and an electronic device, according to an exemplary embodiment.

FIG. 18 is a side cross-sectional view of a light-emitting device 1800 that may be included in a light-emitting device package and an electronic device, according to another exemplary embodiment. The light-emitting device 1800 may be any one of the light-emitting devices 13, 13A, and 13B included in the light-emitting device packages 100, 100A, 100B, 200, 200A, 200B, 300, 300A, 400, and 400A described above with reference to FIGS. 1 to 13B, or may be any one of the light-emitting devices 13 included in the electronic devices 500 and 600 described above with reference to FIGS. 14 and 15.

Referring to FIG. 18, the light-emitting device 1800 may include a mounting substrate 1820, and an LED chip 1800 mounted on the mounting substrate 1820. The LED chip 1810 may be a different LED chip from the above-described LED chip.

The LED chip 1810 may include a light-emitting stack structure S disposed on one surface of a substrate 1801, and first and second electrodes 1808a and 1808b disposed on an opposite surface of the substrate 1801 with respect to the light-emitting stack structure S. In addition, the LED chip 1810 may include an insulating part 1803 that covers the first and second electrodes 1808a and 1808b.

The first and second electrodes 1808a and 1808b may be connected to first and second electrode pads 1819a and 1819b through first and second electrical connection parts 1809a and 1809b.

The light-emitting stack structure S may include a first-conductivity-type semiconductor layer 1804, an active layer 1805, and a second-conductivity-type semiconductor layer 1806, which are sequentially stacked on the substrate 1801. The first electrode 1808a may be provided as a conductive via that penetrates the second-conductivity-type semiconductor 1806 and the active layer 1805 and is connected to the first-conductivity-type semiconductor layer 1804. The second electrode 1808B may be connected to the second-conductivity-type semiconductor layer 1806.

A plurality of vias may be formed in one light-emitting device region. The number of the vias and the contact area of the vias may be adjusted such that an area occupied on a plane by a region where the plurality of vias come into contact with the first-conductivity-type semiconductor ranges from about 1% to about 5% of an area of the light-emitting device region. A radius of the region where the plurality of vias come into contact with the first-conductivity-type semiconductor on a plane may range from about 5 µm to about 50 µm. The number of the vias may be about 1 to about 50 per light-emitting region according to the area of the light-emitting device region. The vias may be arranged in a matrix form. Specifically, although the number of the vias varies according to the area of the light-emitting device region, the number of the vias may be three or more, and a distance between the vias may be about 100 µm to about 500 µm in rows and columns. More specifically, the distance between the vias may about 150 µm to about 450 µm in rows and columns. When the distance between the vias is less than about 100 µm, the number of the vias may increase and the light-emitting area may be relatively reduced and the luminous efficiency may be decreased. When the distance between the vias is greater than about 500 µm, current spreading may be difficult and the luminous efficiency may be decreased. A depth of the vias varies according to thicknesses of the second-conductivity-type semiconductor layer 1806 and the active layer 1805, but may range from about 0.5 µm to about 5.0 µm.

The first and second electrodes 1808a and 1808b may be formed by depositing a conductive ohmic material on the light-emitting stack structure S. The first and second electrodes 1808a and 1808b may include one selected from the group consisting of silver (Ag), aluminum (Al), nickel (Ni), chromium (Cr), copper (Cu), gold (Au), palladium (Pd), platinum (Pt), tin (Sn), titanium (Ti), tungsten (W), rhodium (Rh), iridium (Jr), ruthenium (Ru), manganese (Mg), zinc (Zn), and any alloys thereof. For example, in the second electrode 1808b, an ohmic electrode including an Ag layer may be stacked with respect to the second-conductivity-type semiconductor layer 1806. The ohmic electrode may also function as a light reflection layer. A single layer of nickel (Ni), titanium (Ti), platinum (Pt), or tungsten (W) or an alloy layer thereof may be selectively and alternately stacked on the Ag layer. Specifically, an Ni/Ti layer, a Ti/Pt layer, or a Ti/W layer may be stacked under the Ag layer, or these layers may be alternately stacked under the Ag layer.

In the first electrode 1808a, a Cr layer may be stacked with respect to the first-conductivity-type semiconductor layer, and an Au/Pt/Ti layer may be stacked on the Cr layer. Alternatively, an Al layer may be stacked with respect to the second-conductivity-type semiconductor layer, and a Ti/Ni/Au layer may be stacked on the Al layer.

In order to improve ohmic characteristics or reflection characteristics, the first and second electrodes 1808a and 1808b may use various materials or stack structures, except for those used in the above-described exemplary embodiment.

The insulating part 1803 may include an open region that exposes at least a portion of the first and second electrodes 1808a and 1808b. The first and second electrode pads 1819a and 1819b may be connected to the first and second electrodes 1808a and 1808b. The insulating part 1803 may be formed by depositing $SiO_2$ and/or SiN to a thickness of about 0.01 µm to about 3 µm at a temperature of about 500° C. or less through a chemical vapor deposition (CVD) process.

The first and second electrodes 1808a and 1808b may be disposed in the same direction. As described below, the first and second electrodes 1808a and 1808b may be mounted on a lead frame or the like in a so-called flip-chip form. In this case, the first and second electrodes 1808a and 1808 may be disposed to be directed in the same direction. In particular, the first electrode 1808a may penetrate the second-conductivity-type semiconductor layer 1806 and the active layer 1805, and the first electrical connection part 1809a may be formed by the first electrode 1808a having the conductive vias connected to the first-conductivity-type semiconductor layer 1804 in the light-emitting stack structure S.

The number, the shape, and the pitch of the conductive vias, and the contact area of the conductive vias with the first-conductivity-type semiconductor layer 1804, may be appropriately adjusted so as to reduce a contact resistance. The conductive vias and the first electrical connection part 1809a may be arranged to form rows and columns, thus improving a current flow.

Another electrode structure may include the second electrode 1808b disposed directly on the second-conductivity-type semiconductor later 1806, and the second electrical connection part 1809b disposed on the second electrode 1808b. The second electrode 1808b may form an electrical ohmic with the second-conductivity-type semiconductor layer 1806 and includes a light reflection material. Therefore, light emitted from the active layer 1805 may be effectively emitted toward the substrate 1801 in a state in which the LED chip 1810 is mounted in a flip-chip structure. According to an exemplary embodiment, the second electrode 1808b may include a transparent conductive material such as a transparent conductive oxide according to a main light-emitting direction.

The above-described two electrode structures may be electrically separated from each other by the insulating part 1803. The insulating part 1803 may include any material having electrically insulating characteristics or any material having insulating characteristics. In addition, the insulating part 1803 may include a material having a low light absorption rate. For example, the insulating part 1803 may include silicon oxide or silicon nitride, such as $SiO_2$, $SiO_xN_y$, or $Si_xN_y$. If necessary or desired, a light reflection structure may be formed by dispersing a light reflective filler in a transparent material.

The first and second electrode pads 1819a and 1819b may be respectively connected to the first and second electrical connection parts 1809a and 1809b and function as external terminals of the LED chip 1810. For example, the first and second electrode pads 1819a and 1819b may include Au, Ag, Al, Ti, W, Cu, Sn, Ni, Pt, Cr, NiSn, TiW, AuSn, or eutectic materials thereof. In this case, the first and second electrode pads 1819a and 1819b may be bonded to the mounting substrate 1820 by using the eutectic metal. Therefore, a separate solder bump, which is commonly required for flip-chip bonding, may not be used. A heat dissipation effect may be more excellent in the case of the mounting method using the eutectic material than in the case of using the solder pump. In this case, in order to obtain the excellent heat dissipation effect, the first and second electrode pads 1819a and 1819b may be formed to occupy a wide area.

The substrate 1801 and the light-emitting laminate S may be understood with reference to the above descriptions above unless otherwise described. Although not illustrated in detail, a buffer layer may be further formed between the light-emitting stack structure S and the substrate 1801. The buffer layer may be an undoped semiconductor layer including a nitride or the like and may reduce lattice defects of the light-emitting stack structure S grown thereon.

The substrate 1801 may have first and second principal surfaces facing each other. An uneven structure may be formed on at least one of the first and second principal surfaces. The uneven structure may be formed on one surface of the substrate 1801 by partially etching the substrate 1801, and the uneven structure may include the same material as the substrate 1801. Alternatively, the uneven structure may include different materials from the substrate 1801. As described above, the light beam, which is emitted from the active layer 1805, may be emitted through various paths by forming the uneven structure at an interface between the substrate 1801 and the first-conductivity-type semiconductor layer 1804. Thus, a light absorption rate in the semiconductor layer may decrease and a light scattering rate may increase, thus improving a light extraction efficiency.

Specifically, the uneven structure may be formed to have a regular or irregular shape. The different materials forming the uneven structure may include a transparent conductive material, a transparent insulating material, or an excellent reflective material. Examples of the transparent insulating material may include a material such as $SiO_2$, $S_iN_x$, $Al_2O_3$, HfO, $TiO_2$, or ZrO. Examples of the transparent conductive material may include a transparent conductive oxide (TCO) such as ZnO or indium oxide containing an additive (manganese (Mg), silver (Ag), zinc (Zn), scandium (Sc), hafnium (Hf), zircon (Zr), tellurium (Te), selenium (Se), tantalum (Ta), tungsten (W), niobium (Nb), copper (Cu), silicon (Si), nickel (Ni), cobalt (Co), molybdenum (Mo), chrome (Cr), or tin (Sn)). Examples of the excellent reflective material may include Ag, Al, or a distributed Bragg reflector (DBR) including multi-layers having different refractive indexes. However, the exemplary embodiments are not limited thereto.

The substrate 1801 may be removed from the first-conductivity-type semiconductor layer 1804. The substrate 1801 may be removed by using a laser lift-off (LLO) process using a laser, an etching process, or a polishing process. In addition, after the substrate 1801 is removed, an uneven structure may be formed on the first-conductivity-type semiconductor layer 1804.

The LED chip 1810 may be mounted on the mounting substrate 1820. The mounting substrate 1820 may include an upper electrode layer 1812b on an upper surface of a substrate body 1811, a lower electrode layer 1812a on a lower surface of the substrate body 1811, and vias 1813 that penetrate the substrate body 1811 so as to connect the upper electrode layer 1812b to the lower electrode layer 1812a. The substrate body 1811 may include a resin, a ceramic, or a metal. The upper electrode layer 1812b or the lower electrode layer 1812a may be a metal layer including Au, Cu, Ag, or Al. However, a substrate 1820, on which the LED chip 1810 is to be mounted, is not limited to the mounting substrate 1820 illustrated in FIG. 18. Any substrate may be used as long as a wiring structure for driving the LED chip 1810 is formed on the substrate. For example, the mounting substrate 1820 may also be provided as a package structure in which an LED chip is mounted on a package body having a pair of lead frames.

Figure 19:
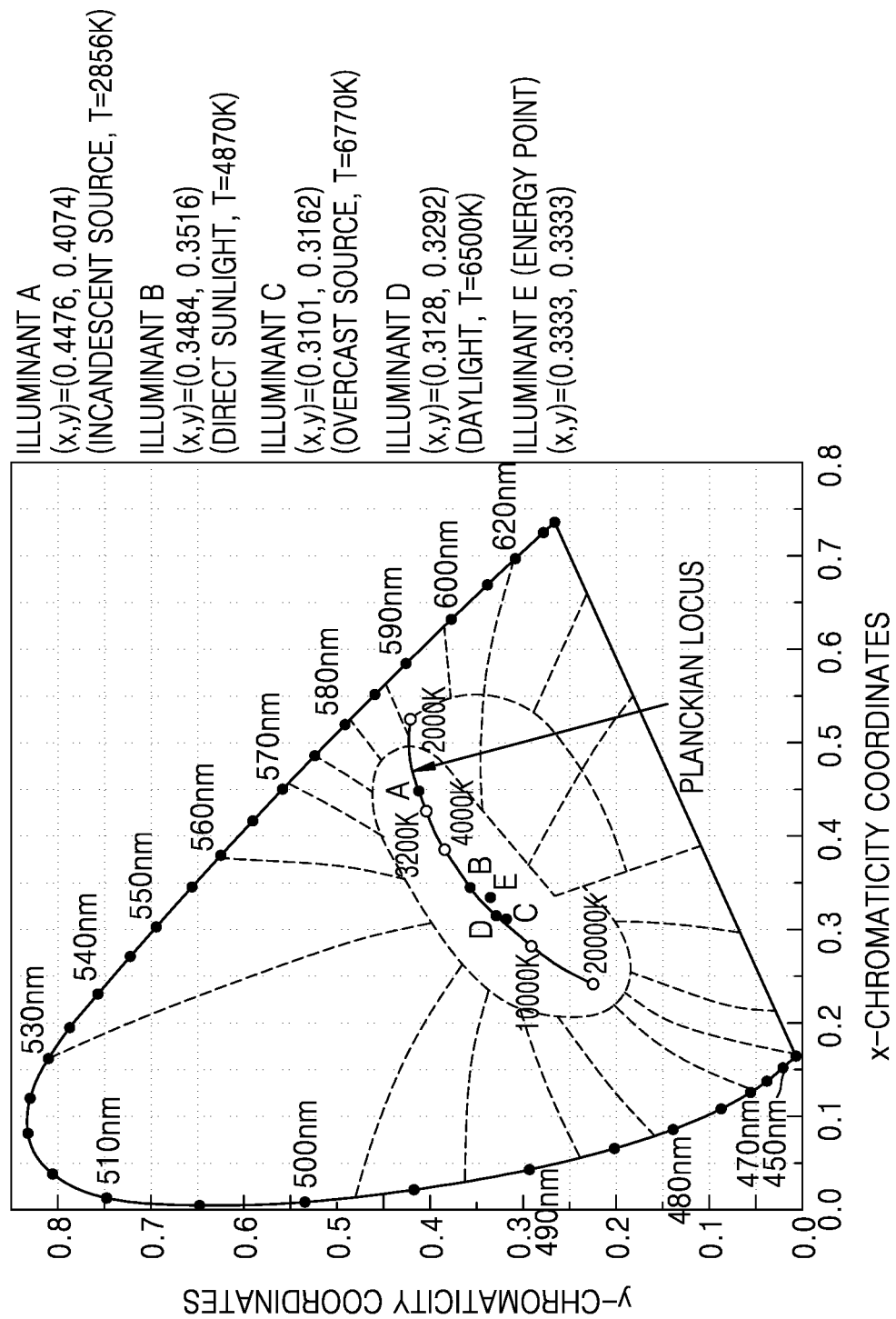
FIG. 19 is a graph showing a Planckian spectrum.

FIG. 19 is a graph showing a Planckian spectrum. The light-emitting devices 13, 13A, and 13B or the LED chips 1600, 1700, and 1800 described above with reference to FIGS. 1 to 18 may emit blue light, green light, and red light according to a type of a compound semiconductor forming the light-emitting devices 13, 13A, and 13B or the LED chips 1600, 1700, and 1800. Alternatively, the light-emitting devices 13, 13A, and 13B or the LED chips 1600, 1700, and 1800 may emit UV light. The light-emitting devices 13, 13A, and 13B or the LED chips 1600, 1700, and 1800 may adjust a color rendering index (CRI) to about 40 to about 100. In addition, the light-emitting devices 13, 13A, and 13B or the LED chips 1600, 1700, and 1800 may generate a variety of white light having a color temperature of about 2,000 K to 20,000 K. If necessary or desired, the light-emitting devices 13, 13A, and 13B or the LED chips 1600, 1700, and 1800 may adjust an illumination color according to a surrounding atmosphere or a mood by generating infrared light or visible light, such as violet light, blue light, green light, red light, and orange light. In addition, the light-emitting devices 13, 13A, and 13B or the LED chips 1600, 1700, and 1800 may generate light having a specific wavelength so as to promote the growth of plants.

Referring to FIG. 19, the white light, which is generated by the combination of the yellow, green and red phosphors, and/or green and red light-emitting devices in the blue light-emitting device, has two or more peak wavelengths. (x,y) coordinates of the white light in the CIE 1931 coordinate system may be positioned on a line segment connecting coordinates (0.4476, 0.4074), (0.3484, 0.3516), (0.3101, 0.3162), (0.3128, 0.3292), and (0.3333, 0.3333). Alternatively, the (x,y) coordinates of the white light may be positioned in a region surrounded by the line segment and a black-body radiator spectrum. The color temperature of the white light may be in the range of about 2,000K to about 20,000K.

In some exemplary embodiments, the phosphors used in the light-emitting device may have the following empirical formulas and colors.

Oxide-based: yellow color and green color (Y, Lu, Se, La, Gd, Sm)3(Ga, Al)5O12:Ce, and blue color BaMgAl10O17:Eu, 3Sr3(PO$_4$)2.CaCl:Eu Silicate: yellow color and green color (Ba,Sr)2SiO4:Eu, yellow color and orange color (Ba,Sr)3SiO5:Eu Nitride-based: green color β-SiAlON:Eu, yellow color (La, Gd, Lu, Y, Sc)3Si6N11:Ce, orange color α-SiAlON:Eu, and red color (Sr, Ca)AlSiN3:Eu, (Sr, Ca)AlSi(ON)3:Eu, (Sr, Ca)2Si5N8:Eu, (Sr, Ca)2Si5(ON)8:Eu, (Sr, Ba)SiAl4N7:Eu Sulfide-based: red color (Sr, Ca)S:Eu, (Y, Gd)2O2S:Eu, and green color SrGa2S4:Eu Fluoride-based: KSF-based red color K2SiF6:Mn4+

The composition of the phosphor may need to fundamentally conform with stoichiometry, and the respective elements may be substituted by other elements included in the respective groups of the periodic table. For example, strontium (Sr) may be substituted by at least one selected from the group consisting of barium (Ba), calcium (Ca), and magnesium (Mg) of alkaline-earth group II, and Y may be substituted by at least one selected from the group consisting of terbium (Tb), lutetium (Lu), scandium (Sc), and gadolinium (Gd) of the lanthanide series. In addition, europium (Eu), which is an activator, may be substituted by at least one selected from the group consisting of cerium (Ce), terbium (Tb), praseodymium (Pr), erbium (Er), and ytterbium (Yb) according to a desired energy level. The activator may be applied solely or a sub activator may be additionally applied so as to change characteristics. Furthermore, as phosphor alternatives, materials such as a quantum dot (QD) may be applied. A phosphor and a QD may be used in the LED solely or in combination. The QD may have a structure including a core (a diameter of about 3 nm to about 10 nm) such as CdSe or InP, a shell (a thickness of about 0.5 nm to about 2 nm) such as ZnS or ZnSe, and a ligand for stabilizing the core and the shell and may implement various colors according to sizes.

The phosphors or the quantum dots may be applied by using at least one selected from the group consisting of a method of spraying phosphors or quantum dots on a light-emitting device, a method of covering as a film, and a method of attaching as a sheet of film or ceramic phosphor.

As the spraying method, dispensing or spray coating is commonly used. The dispensing includes a pneumatic method and a mechanical method such as screw or linear type. Through a jetting method, an amount of dotting may be controlled through a very small amount of discharging and color coordinates may be controlled therethrough. In case of a method of collectively applying phosphors at a wafer level or on a light-emitting device substrate by using a spraying method, productivity may be enhanced and a thickness may be easily controlled.

The method of covering phosphors or quantum dots as a film on a light-emitting device or an LED chip may include electrophoresis, screen printing, or a phosphor molding method, and these methods may have a difference according to whether a lateral surface of a chip is required to be coated.

When two or more types of phosphor layers having different light-emitting wavelengths are stacked, a distributed Bragg reflector (DBR) (ODR) layer may be included between the respective layers in order to minimize wavelength re-absorption and interference between the light-emitting device (L in FIG. 8) and the phosphor (440 in FIG. 8). In order to form a uniform coated film, a phosphor is fabricated as a film or a ceramic form and attached to a chip.

In order to control the efficiency of a long-wavelength light-emitting phosphor reabsorbing light emitted at a short wavelength among two or more phosphors having different light-emitting wavelengths, two or more phosphor layers having different light-emitting wavelengths may be divided. In order to minimize wavelength reabsorption and interference of the LED chip and the two or more phosphors, a DBR (ODR) layer may be included between the layers.

In order to form a uniform coated film, a phosphor is prepared as a film or a ceramic form and is then attached to the LED chip or the light-emitting device.

In order to differentiate light efficiency and light distribution characteristics, a light conversion material may be positioned in a remote form. In this case, the light conversion material may be positioned together with a material such as a light-transmissive polymer or glass according to durability and heat resistance.

Since a phosphor applying technique plays the most important role in determining light characteristics in the light-emitting device, techniques of controlling a thickness of a phosphor application layer, a uniform phosphor distribution, and the like, have been variously researched. The quantum dot may also be positioned in the LED chip or the light-emitting device in the same manner as that of the phosphor, and may be positioned in glass or light-transmissive polymer material to perform optical conversion.

In order to protect the LED chip or the light-emitting device from an external environment or improve light extraction efficiency, a light-transmissive material may be disposed on the LED chip or the light-emitting device as a filling material. At this time, the light-transmissive material may include a transparent organic material such as epoxy, silicon, or a hybrid of epoxy and silicon. The transparent organic material may be used by curing through heating, light irradiation, or time elapse. In the silicon, polydimethylsiloxane may be classified as a methyl group, and polymethylphenylsiloxane may be classified as a phenyl group. The silicon has a difference in a refractive index, a moisture permeation rate, a light transmittance, lightfastness, and thermostability according to the methyl-based material and the phenyl-based material. In addition, the silicon has a difference in a curing rate according to a cross-linker and a catalyst agent and thus influences phosphor dispersion.

The light extraction efficiency varies according to a refractive index of the filling material. In order to minimize a difference between a refractive index of an outermost medium of the chip that emits blue light and a refraction index of a portion from which the blue light is emitted to the air, two or more silicones having different refractive indexes may be sequentially stacked. Generally, the methyl-based material is most excellent in thermostability and a variation in a temperature increase is reduced in the order of the phenyl-based material, the hybrid, and the epoxy. The silicon may be classified into a gel type, an elastomer type, and a resin type according to hardness.

In order to guide the light irradiated from a light source, a lens may be further included in the light-emitting device. The lens may be disposed by a method of attaching a pre-molded lens on the LED chip or the light-emitting device or a method of injecting a fluidal organic solvent into a mold frame mounted with the LED chip or the light-emitting device and solidifying the fluid organic solvent. The method of attaching the lens may include a method of directly attaching the lens to the filling material or a method of attaching only an edge of the light-emitting device and an edge of the lens such that a space is formed between the lens and the filling material. The method of injecting the fluid organic solvent to the mold frame may include injection molding, transfer molding, or compression molding. Light distribution characteristics may be changed according to the shape of the lens (a concave shape, a convex shape, an uneven shape, a conic shape, or a geometric structure). The shape of the lens may be modified according to the required efficiency and light distribution characteristics.

Figure 20:
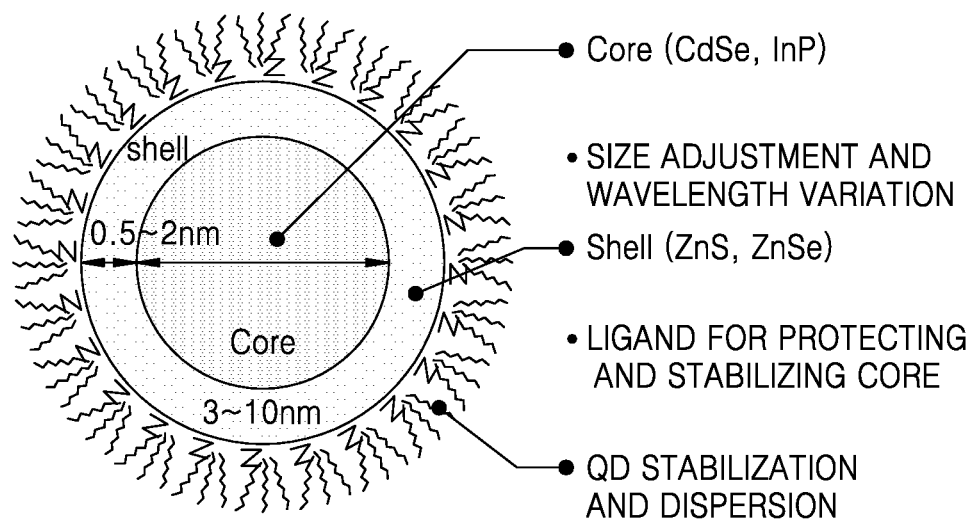
FIG. 20 is a view of a quantum dot structure.

FIG. 20 is a view of a QD structure.

FIG. 21 is a table showing types of phosphors according to applications of a white light-emitting device using a blue light-emitting device.

Figure 22:
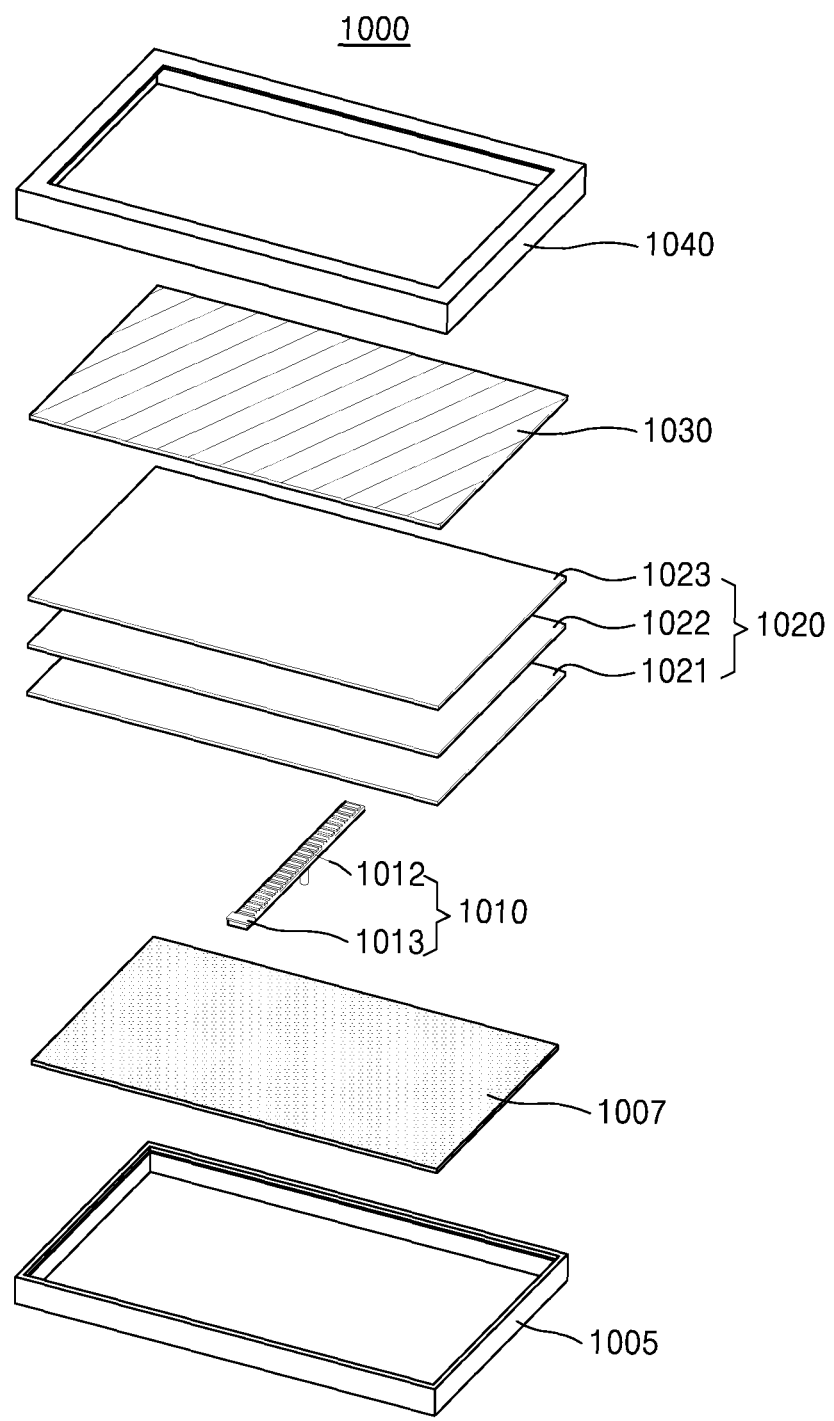
FIG. 22 is an exploded perspective view of a direct-type backlight assembly including a light-emitting device package or an electronic device, according to an exemplary embodiment.

FIG. 22 is an exploded perspective view of a direct-type backlight assembly 1000 including a light-emitting device package or an electronic device, according to an exemplary embodiment.

Referring to FIG. 22, the direct-type backlight assembly 1000 may include a lower cover 1005, a reflection sheet 1007, a light-emitting module 1010, an optical sheet 1020, a liquid crystal panel 1030, and an upper cover 1040.

The light-emitting module 1010 may include a light-emitting device array 1012 including one or more light-emitting devices and a circuit board, and/or a controller (rank storage unit, a driving integrated circuit (IC), or the like) 1013. The light-emitting module 1010 may include at least one of the light-emitting device packages 100, 100A, 100B, 200, 200A, 200B, 300, 300A, 400, and 400A described above with reference to FIGS. 1 to 13B and the electronic devices 500 and 600 described above with reference to FIGS. 14 and 15.

The controller 1013 may store and control driving information of the respective light-emitting devices included in the light-emitting device array 1012 and/or a driving program that adjusts the turning-on/off or brightness of the respective light-emitting devices individually or on a group basis. The light-emitting device array 1012 may receive information on power for light emission and driving information from a light-emitting device driver disposed outside of the direct-type backlight assembly 1000. The controller 1013 may sense the driving information from the light-emitting device driver and adjust a current or the like supplied to the light-emitting devices of the light-emitting device array 1012 based on the sensed driving information.

The optical sheet 1020 may be disposed on the light-emitting module 1010 and may include a diffusion sheet 1021, a light concentration sheet 1022, and a protection sheet 1023. That is, the diffusion sheet 1021, the light concentration sheet 1022, and the protection sheet 1023 may be sequentially disposed on the light-emitting module 1010. The diffusion sheet 1021 may diffuse light emitted from the light-emitting module 1010. The light concentration sheet 1022 may concentrate the light diffused from the diffusion sheet 1021 and increase luminance. The protection sheet 1023 may protect the light concentration sheet 1022 and secure a viewing angle. The upper cover 1040 may surround an edge of the optical sheet 1020 and may be assembled with the lower cover 1005. The liquid crystal panel 1030 may be further disposed between the optical sheet 1020 and the upper cover 1040.

The liquid crystal panel 1030 may include a pair of a first substrate (not illustrated) and a second substrate (not illustrated) attached to face each other, with a liquid crystal being disposed therebetween. A plurality of gate lines and a plurality of data lines may intersect with one another on the first substrate to define pixel regions. Thin film transistors (TFTs) may be disposed at intersection points of the pixel regions and may be respectively connected to pixel electrodes mounted on the pixel regions. The second substrate may include R, G, and B color filters corresponding to the pixel regions, and a black matrix that covers edges of the R, G, and B color filters, the gate lines, the data lines, and the TFTs.

Figure 23:
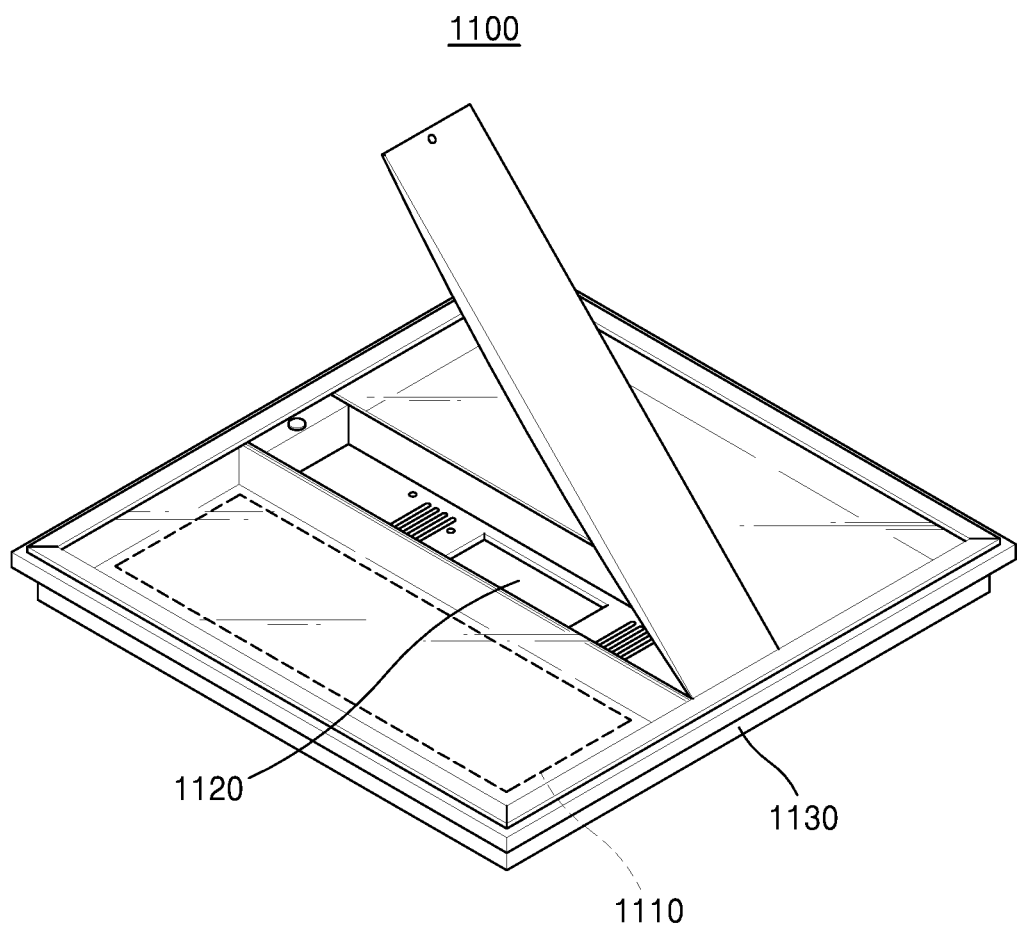
FIG. 23 is a perspective view of a flat semiconductor light-emitting device including a light-emitting device array and a light-emitting device module, according to an exemplary embodiment.

FIG. 23 is a perspective view of a flat semiconductor light-emitting device 1100 including a light-emitting device array and a light-emitting device module, according to an exemplary embodiment.

Referring to FIG. 23, the flat semiconductor light-emitting device 1100 may include a light source 1110, a power supply 1120, and a housing 1130. The light source 1110 may include a light-emitting device array that includes the light-emitting devices 1700, 1800, and 1900, the light-emitting device packages 100, 100A, 100B, 200, 200A, 200B, 300, 300A, 400, and 400A, or the electronic devices 500 and 600, according to the exemplary embodiments.

The light source 1110 may include the light-emitting device array and may have a generally planar shape.

The power supply 1120 may be configured to supply power to the light source 1110.

The housing 1130 may define an accommodation space that accommodates the light source 1110 and the power supply 1120 and may be formed to have a cubical shape, one side of which is opened, but is not limited thereto. The light source 1110 may be disposed to emit light toward the opened side of the housing 1130.

Figure 24:
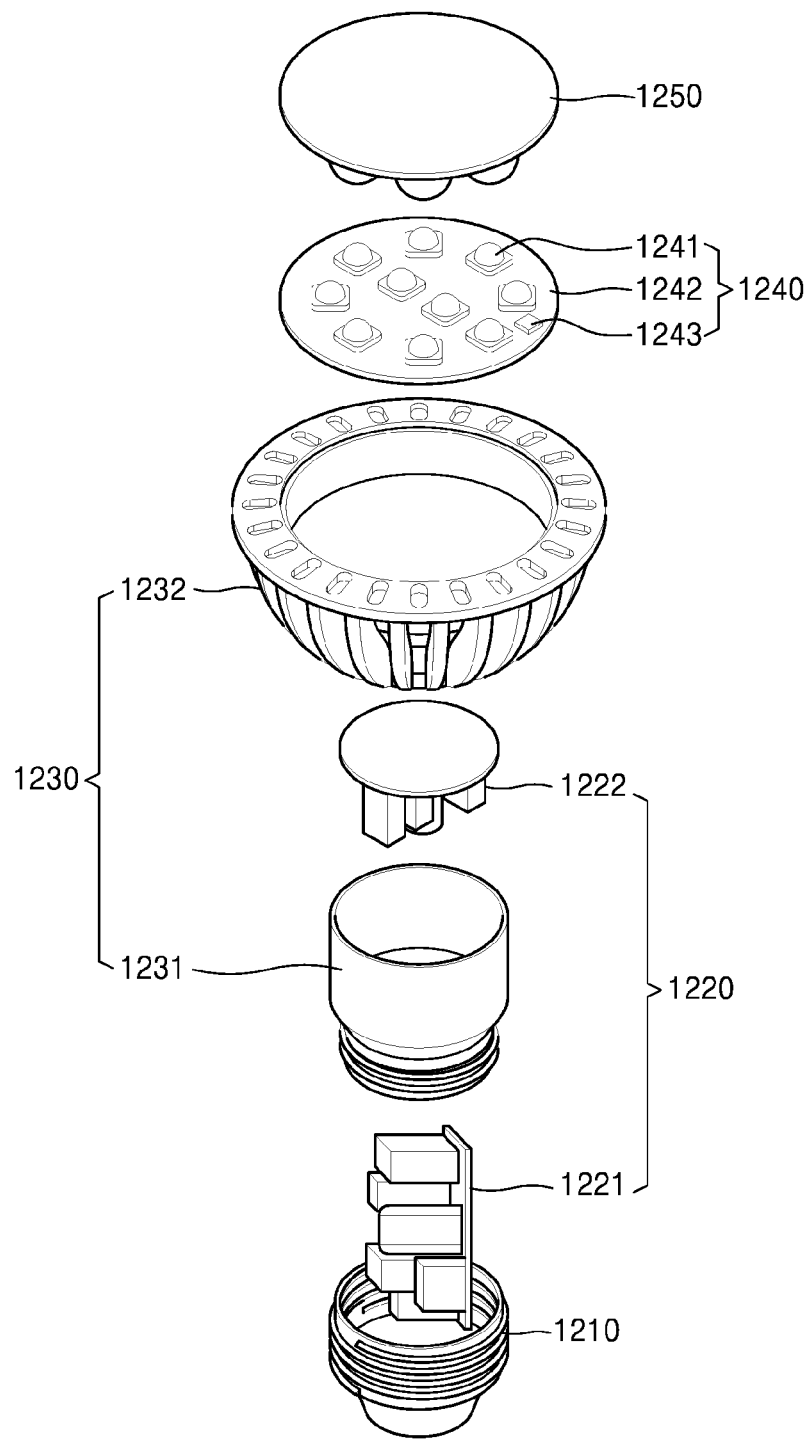
FIG. 24 is an exploded perspective view of a bulb-type lamp as a semiconductor light-emitting device including a light-emitting device array and a light-emitting device module, according to an exemplary embodiment.

FIG. 24 is an exploded perspective view of a bulb-type lamp as a semiconductor light-emitting device 1200 including a light-emitting device array and a light-emitting device module, according to an exemplary embodiment.

Referring to FIG. 24, the semiconductor light-emitting device 1200 may include a socket 1210, a power supply 1220, a heat sink 1230, a light source 1240, and an optical unit 1250. The light source 1240 may include a light-emitting device array that includes the light-emitting devices 1700, 1800, and 1900, the light-emitting device packages 100, 100A, 100B, 200, 200A, 200B, 300, 300A, 400, and 400A, or the electronic devices 500 and 600, according to the exemplary embodiments.

The socket 1210 may replace an existing lighting device. Power may be supplied to the semiconductor light-emitting device 1200 through the socket 1210. The power supply 1220 may be dissembled into a first power supply 1221 and a second power supply 1222.

The heat sink 1230 may include an internal heat sink 1231 and an external heat sink 1232. The internal heat sink 1131 may be directly connected to the light source 1240 and/or the power supply 1220, so that heat may be transferred to the external heat sink 1232. The optical unit 1250 may include an internal optical unit and an external optical unit and may be configured such that the light emitted from the light source 1240 is uniformly dispersed.

The light source 1240 may receive power from the power supply 1220 and emit light to the optical unit 1250. The light source 1240 may include a light-emitting device array that includes the above-described light-emitting devices according to the exemplary embodiments. The light source 1240 may include one or more light-emitting device packages 1241, a circuit board 1242, and a rank storage unit 1243. The rank storage unit 1243 may store rank information of the one or more light-emitting device packages 1241.

The light-emitting device packages 1241 included in the light source 1240 may be the same type of light-emitting device packages that generate light having the same wavelength. Alternatively, the light-emitting device packages 1241 may be different types of light-emitting device packages that generate light having different wavelengths.

For example, the light-emitting device packages 1241 may include at least one of a light-emitting device that emits white light by combining a yellow phosphor, a green phosphor, a red phosphor, or an orange phosphor with a blue light-emitting device, a violet light-emitting device, a blue light-emitting device, a green light-emitting device, a red light-emitting device, and an infrared light-emitting device, so that a color temperature and a CRI of the white light are adjusted. Alternatively, when an LED chip emits blue light, the light-emitting device packages 1241, which includes at least one of the yellow phosphor, the green phosphor, and the red phosphor, may emit white light having various color temperatures according to a mixture ratio of the phosphors. The light-emitting device packages 1241, in which the green or red phosphor is applied to the blue LED chip, may emit green light or red light. The color temperature and the CRI of the white light may be adjusted by combining a white light-emitting device package and a green or red light-emitting device package. In addition, the light-emitting device packages 1241 may include at least one of a violet light-emitting device, a blue light-emitting device, a green light-emitting device, a red light-emitting device, and an infrared light-emitting device.

Figure 25:
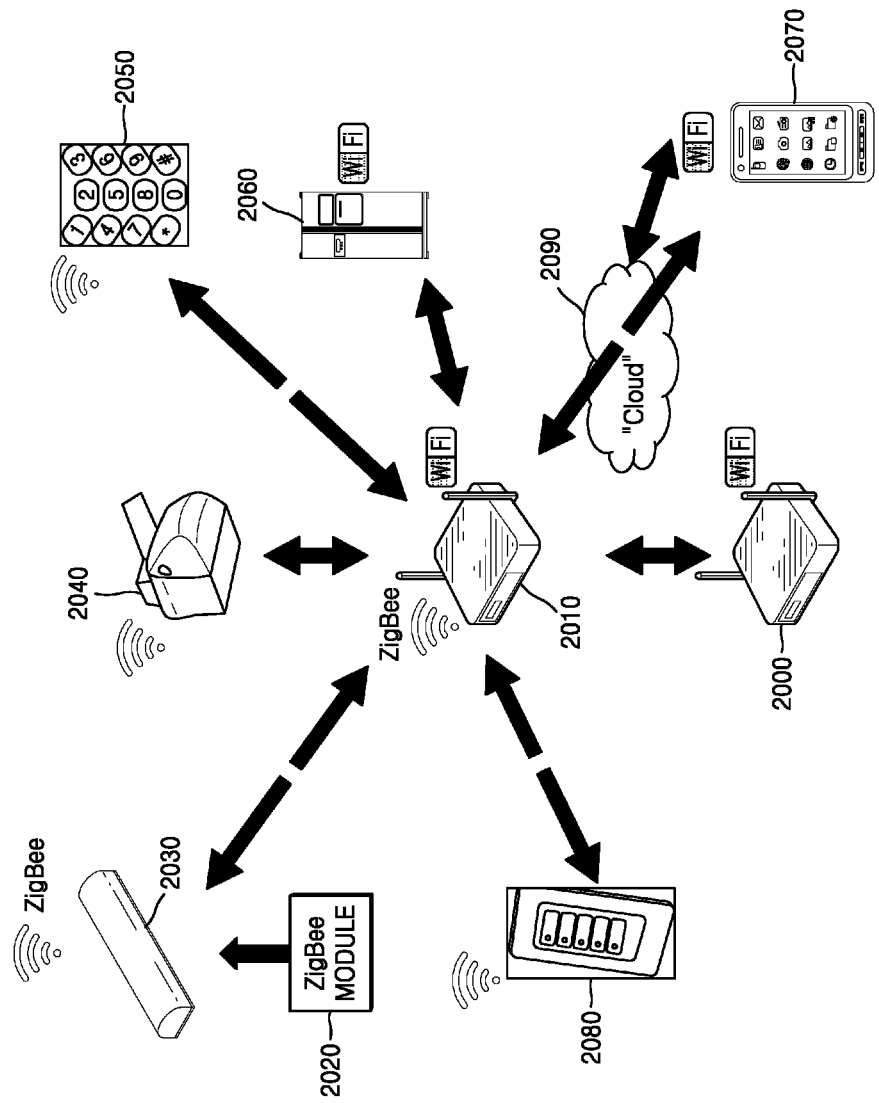
FIGS. 25 and 26 are diagrams of a home network to which a lighting system using a light-emitting device package or an electronic device is applied, according to an exemplary embodiment.
Figure 26:
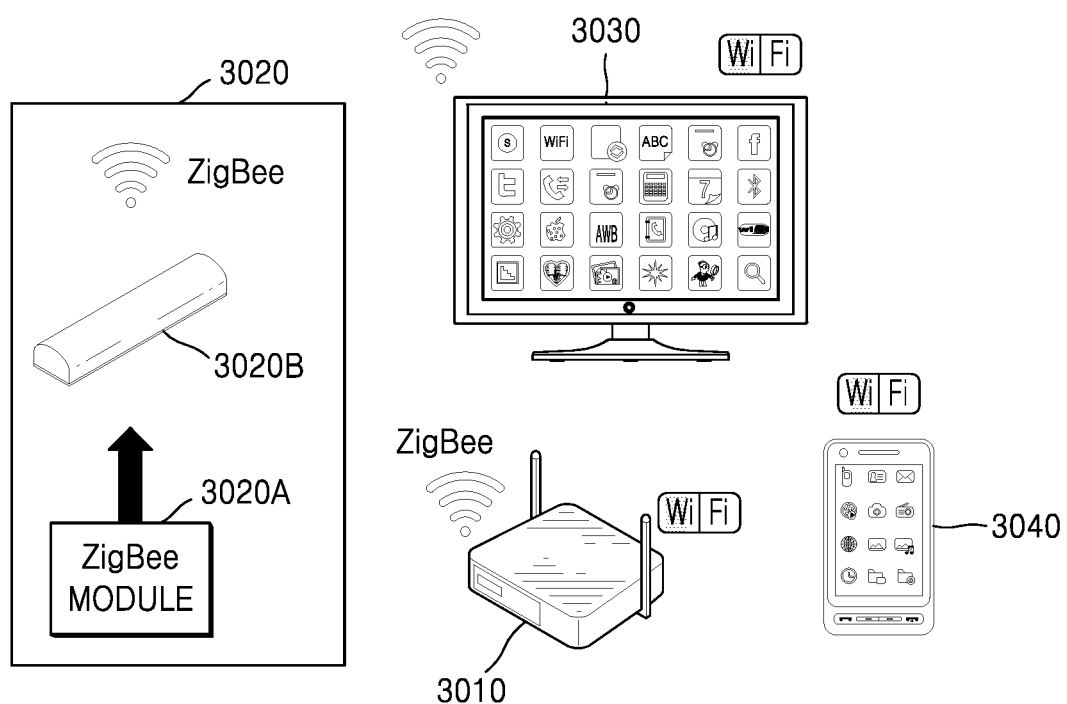

FIGS. 25 and 26 are diagrams of a home network to which a lighting system using a light-emitting device package or an electronic device is applied, according to an exemplary embodiment.

Referring to FIGS. 25 and 26, the home network may include a home wireless router 2000, a gateway hub 2010, a ZigBee module 2020, an LED lamp 2030, a garage, a door lock 2040, a wireless door lock 2050, a home application 2060, a mobile phone 2070, a wall-mounted switch 2080, and a cloud network 2090.

By using an in-home wireless communication (ZigBee, WiFi, or the like), it is possible to automatically control the on/off operation, color temperature, CRI, and/or brightness of the lighting according to an operating state of a bedroom, a living room, a door, a storehouse, or home appliances, and a surrounding environment and situation. For example, as illustrated in FIG. 26, the brightness, color temperature, and/or CRI of a lighting device 3020B may be automatically adjusted by using a gateway 3010 and a ZigBee module 3020A according to a kind of a TV program aired on a TV 3030 or a screen brightness of the TV 3030. When a program value of a TV program is a human drama, the lighting device 3020B lowers a color temperature to 12,000K or less and adjusts a color sense according to a preset value, thus creating a cozy atmosphere. For example, the color temperature of the lighting device 3020B may be adjusted to 5,000K. On the other hand, when a program value of a TV program is a gag program, the lighting device 3020B increases a color temperature to 5,000K or more according to a set value and is adjusted to bluish white light.

In addition, by using a smartphone or a computer, it is possible to control the on/off operation, brightness, color temperature, and/or CRI of the lighting device 3020B through an in-home wireless communication protocol (ZigBee, WiFi, LiFi, or the like) and to control home appliances such as the TV 3030, a refrigerator, an air conditioner, or the like, which is connected thereto. The LiFi communication may refer to a near field communication protocol using visible light of the lighting device 3020B. For example, in-home lamps or home appliances may be controlled using a smartphone by an operation of implementing a lamp control application program of a smartphone displaying color coordinates as illustrated in FIG. 19, an operation of mapping sensors connected to all lamps installed at homes in cooperation with the color coordinates by using ZigBee, WiFi, or LiFi communication protocol, that is, an operation of displaying positions, current setting values, and on/off state values of the in-home lamps, an operation of selecting a lamp located at a specific position and changing a state value thereof, and an operation of changing a state of the lamp according to the changed value.

The ZigBee modules 2020 and 3020A may be integrally modulated with an optical sensor and may be integrally formed with the light-emitting device.

A visible light wireless communication technology is a wireless communication technology that transmits information wirelessly by using light of a visible light wavelength a human can recognize with his or her eyes. The visible light wireless communication technology differs from the existing wired optical communication technology and infrared wireless communication in that the light of the visible light wavelength is used, and differs from the wired optical communication technology in that communication environment is a wireless environment. Contrary to an RF wireless communication technology, the visible light wireless communication technology may freely be used without regulation or permission in terms of frequency use. In addition, the visible light wireless communication technology has excellent physical security and has differentiation that enables a user to confirm a communication link with his or her eyes. Furthermore, the visible light wireless communication technology is a convergence technology that is capable of simultaneously obtaining the unique purpose of the light source and the communication function.

In addition, the LED lamp may be used as an internal or external light source for a vehicle. Examples of the internal light source may include various light sources for a vehicle interior lamp, a reading light, and a dashboard. Examples of the external light source may include various light sources for a headlight, a brake light, a turn indicator lamp, a fog lamp, and a running light.

An LED lamp using a specific wavelength may promote the growth of plants and may stabilize a mood or cure a disease. The LED lamp may be applied as light sources for robots or various machine facilities. In connection with the low power consumption and long lifetime of the LED lamp, it is possible to achieve lighting implementation by using ecofriendly renewable energy power systems such as solar cells or wind power.

While the exemplary embodiments have been particularly shown and described with reference to exemplary embodiments thereof, it will be understood that various changes in form and details may be made therein without departing from the spirit and scope of the following claims.

What is claimed is:

1. A light-emitting device package comprising:
a substrate;
a light-emitting device provided on the substrate and configured to be driven by an AC power supply; and
a capacitor connected in series with the light-emitting device, the capacitor comprising a dielectric formed of a material different from a material of the substrate and a first plate contacting a surface of the light-emitting device;
wherein a capacitance of the capacitor varies according to a variation in temperatures of the light-emitting device and the capacitor, so that a current flowing through the light-emitting device and flowing through the capacitor is maintained at a constant value; and
wherein a width of the dielectric is less than a width of the light-emitting device, the width of the dielectric and the width of the light-emitting device being parallel to the surface of the light-emitting device.

2. The light-emitting device package of claim 1, wherein a variation in the capacitance of the capacitor for a charging time $t_c$ of the capacitor satisfies the following formula:

$$\Delta C = \left[ \frac{C^2 \Delta V(t_c)}{C \Delta V(t_c) + I_0 t_c} \right]$$

where $I_0$ is the current that flows through the light-emitting device and flows through the capacitor and is measured at an initial temperature $T_0$, C is an initial capacitance of the capacitor, $\Delta V(t_c)$ is a variation in a voltage of the light-emitting device, and $t_c$ is the charging time of the capacitor.

3. The light-emitting device package of claim 1, wherein the capacitor further comprises a second plate, the dielectric is provided between the first plate and the second plate, and in order for the capacitor to vary so that the current flowing through the light-emitting device and flowing through the capacitor is maintained at the constant value, a cross-sectional area S of the capacitor, a distance d between the first plate and the second plate, and a variation $$\frac{d\varepsilon_T}{dT}$$

in a dielectric constant of the dielectric with respect to temperature are determined based on the following formula:

$$\Delta C = \frac{dC}{dT} = \left(\varepsilon_0 \frac{S}{D}\right)\frac{d\varepsilon_r}{dT}$$

where $\varepsilon_0$ is a permittivity in free space and $\varepsilon_r$ is a relative permittivity.

4. The light-emitting device package of claim 1, wherein the dielectric penetrates the substrate;
the first plate contacts a top surface of the dielectric; and
the capacitor further comprises a second plate that contacts a bottom surface of the dielectric.

5. The light-emitting device package of claim 4, wherein the light-emitting device is provided on the first plate to overlap the dielectric in a direction perpendicular to a surface of the light-emitting device.

6. The light-emitting device package of claim 5, wherein an overlapping cross-sectional area of the light-emitting device and the dielectric is substantially equal to a cross-sectional area of the dielectric.

7. The light-emitting device package of claim 5, wherein the light-emitting device is of a plurality of light-emitting devices,
the capacitor is of a plurality of capacitors,
the plurality of capacitors comprises a plurality of dielectrics that penetrate the substrate, and a plurality of first plates that respectively come into contact with top surfaces of the plurality of dielectrics, and
the plurality of light-emitting devices are respectively provided on the plurality of first plates so as to overlap the plurality of dielectrics.

8. The light-emitting device package of claim 7, wherein the plurality of capacitors are connected in parallel to one another.

9. The light-emitting device package of claim 4, wherein the light-emitting device is of a plurality of light-emitting devices, and
one of the plurality of light-emitting devices is provided on the first plate so as to overlap the dielectric in a direction perpendicular to a surface of the light-emitting device.

10. The light-emitting device package of claim 1, wherein the light-emitting device package is configured to control a direction of a driving current flowing through the light-emitting device independently from using an LED driver.

11. The light-emitting device package of claim 1, wherein the light-emitting device is thermally coupled to the capacitor.

12. The light-emitting device package of claim 1, wherein the dielectric constant of the dielectric is reduced according to an increase in a temperature of the dielectric.

13. An electronic device comprising:
a substrate;
a light-emitting device package provided on the substrate, the light-emitting device package comprising a light-emitting device driven by an AC power supply; and
a capacitor connected in series with the light-emitting device, the capacitor comprising a dielectric formed of a material different from a material of the substrate and a first plate contacting a surface of the light-emitting device,
wherein the capacitor is configured to have a capacitance which decreases according to an increase in a temperature of the capacitor, and
wherein a width of the dielectric is less than a width of the light-emitting device, the width of the dielectric and the width of the light-emitting device being parallel to the surface of the light-emitting device.

14. The electronic device of claim 13, wherein the capacitor is embedded in the substrate.

15. The electronic device of claim 13, wherein the capacitor is provided in parallel to the light-emitting device package on the substrate.

16. An electronic device, comprising:
a substrate;
a light emitting device provided on the substrate, the light emitting device configured to emit light and thereby generate heat, the light emitting device comprising a first surface; and
a capacitor comprising a second surface which contacts the first surface of the light emitting device, the capacitor and the light emitting device being electrically insulated from each other and configured to exchange the generated heat between the first and second surfaces, the capacitor comprising a material having a capacitance which decreases according to an increase in the exchanged heat so that a current flowing through the light emitting device and flowing through the capacitor is maintained at a constant value,
wherein the capacitor further comprises a dielectric formed of a material different from a material of the substrate, and
wherein a width of the dielectric is less than a width of the light-emitting device, the width of the dielectric and the width of the light-emitting device being parallel to the first surface.

17. The electronic device of claim 16, wherein the capacitor comprises:
a first plate comprising the second surface;
a second plate provided opposite the first plate; and
the dielectric provided between the first plate and the second plate.

18. The electronic device of claim 17, wherein the light emitting device further comprises:
a third surface opposite the first surface; and
a lateral light-emitting device structure comprising:
a first-conductivity-type semiconductor layer formed on the third surface, and
a second-conductivity-type semiconductor layer formed on the third surface.

19. The electronic device of claim 18, wherein the capacitor protrudes inside of the substrate.

20. The light-emitting device package of claim 7, wherein at least two of the plurality of light-emitting devices are connected in anti-parallel to each other so that the light-emitting device package continuously provides light.

* * * * *